(12) United States Patent
Lu et al.

(10) Patent No.: US 11,695,052 B2
(45) Date of Patent: Jul. 4, 2023

(54) III-NITRIDE TRANSISTOR WITH A CAP LAYER FOR RF OPERATION

(71) Applicant: Cambridge Electronics, Inc., Cambridge, MA (US)

(72) Inventors: Bin Lu, Watertown, MA (US); Dongfei Pei, Waban, MA (US); Mark Dipsey, Somerville, MA (US); Hal Emmer, Wayland, MA (US)

(73) Assignee: Finwave Semiconductor, Inc., Belmont, MA (US)

( * ) Notice: Subject to any disclaimer, the term of this patent is extended or adjusted under 35 U.S.C. 154(b) by 0 days.

(21) Appl. No.: 17/185,317

(22) Filed: Feb. 25, 2021

(65) Prior Publication Data

US 2021/0265477 A1 Aug. 26, 2021

Related U.S. Application Data

(60) Provisional application No. 63/041,792, filed on Jun. 19, 2020, provisional application No. 62/981,363, filed on Feb. 25, 2020.

(51) Int. Cl.
*H01L 29/43* (2006.01)
*H01L 29/40* (2006.01)
*H01L 29/778* (2006.01)
*H01L 29/423* (2006.01)

(52) U.S. Cl.
CPC ......... *H01L 29/432* (2013.01); *H01L 29/402* (2013.01); *H01L 29/42312* (2013.01); *H01L 29/778* (2013.01)

(58) Field of Classification Search
CPC ................ H01L 29/432; H01L 29/402; H01L 29/42312; H01L 29/778; H01L 29/404; H01L 29/42316; H01L 29/66462; H01L 29/41766; H01L 29/7786; H01L 29/1066; H01L 29/2003
See application file for complete search history.

(56) References Cited

U.S. PATENT DOCUMENTS

2006/0001042 A1   1/2006  Suzuki et al.
2008/0210978 A1   9/2008  Yabu et al.
(Continued)

OTHER PUBLICATIONS

International Search Report and Written Opinion dated May 6, 2021 in corresponding PCT application No. PCT/US2021/019627.

*Primary Examiner* — Mohammed R Alam
(74) *Attorney, Agent, or Firm* — Nields, Lemack & Frame, LLC

(57) ABSTRACT

This disclosure describes the structure of a transistor that provides improved performance by reducing the off-state capacitance between the source and the drain by using a cap layer to extend the electrical distance between the gate and the source and drain contacts. In certain embodiments, a dielectric layer may be disposed between the gate electrode and the cap layer and vias are created in the dielectric layer to allow the gate electrode to contact the cap layer at select locations. In some embodiments, the gate electrode is offset from the cap layer to allow a more narrow cap layer and to allow additional space between the gate electrode and the drain contact facilitating the inclusion of a field plate. The gate electrode may be configured to only contact a portion of the cap layer.

27 Claims, 18 Drawing Sheets

(56) References Cited

U.S. PATENT DOCUMENTS

| | | | |
|---|---|---|---|
| 2014/0264441 A1* | 9/2014 | Murase | H01L 29/7787 257/190 |
| 2014/0361343 A1 | 12/2014 | Sriram | |
| 2015/0270379 A1* | 9/2015 | Kuraguchi | H01L 29/7786 257/194 |
| 2017/0256538 A1 | 9/2017 | Lu et al. | |
| 2017/0301780 A1* | 10/2017 | Boles | H01L 29/66462 |
| 2021/0296452 A1* | 9/2021 | Hanson | H01L 29/7786 |

* cited by examiner

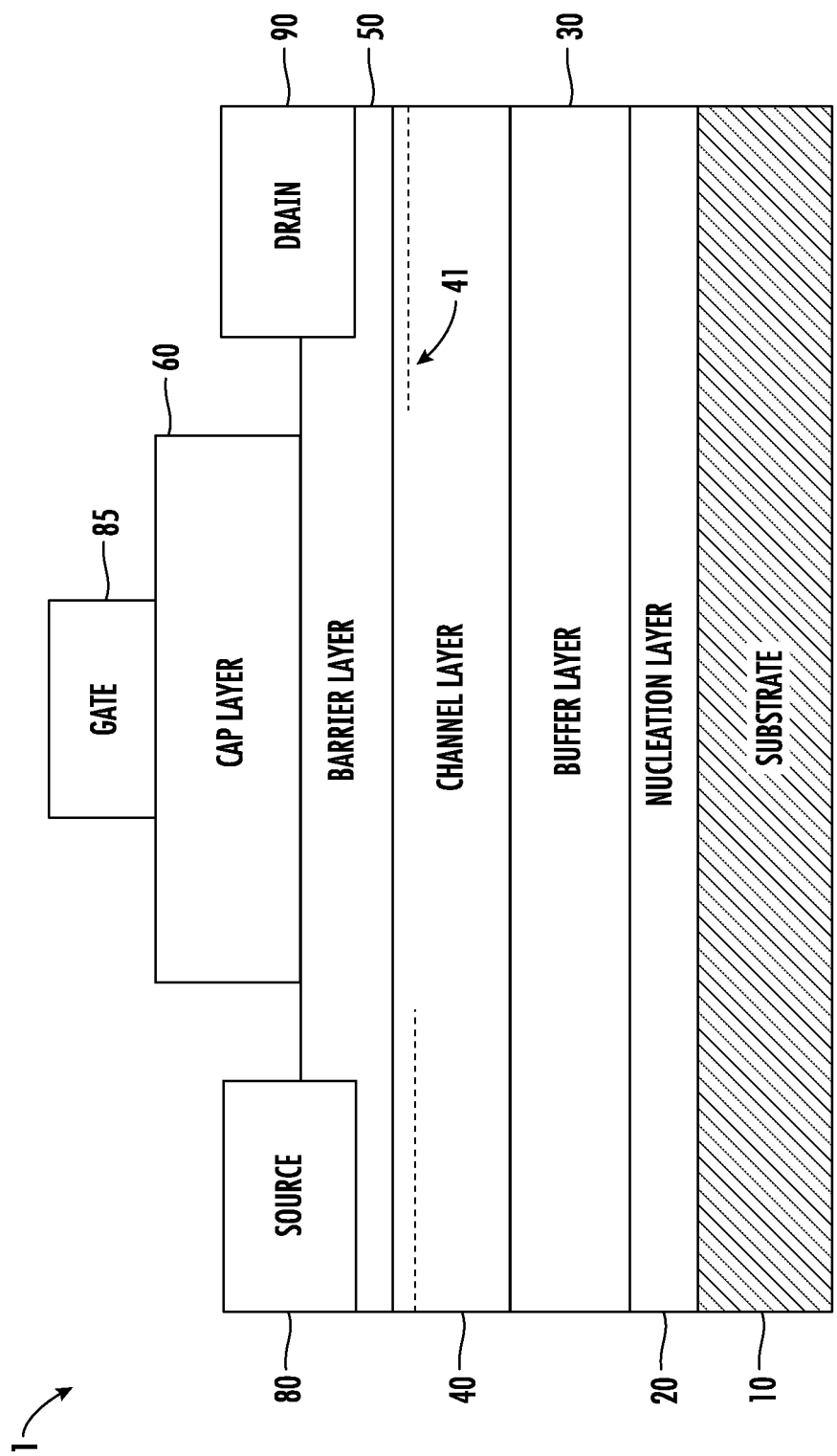

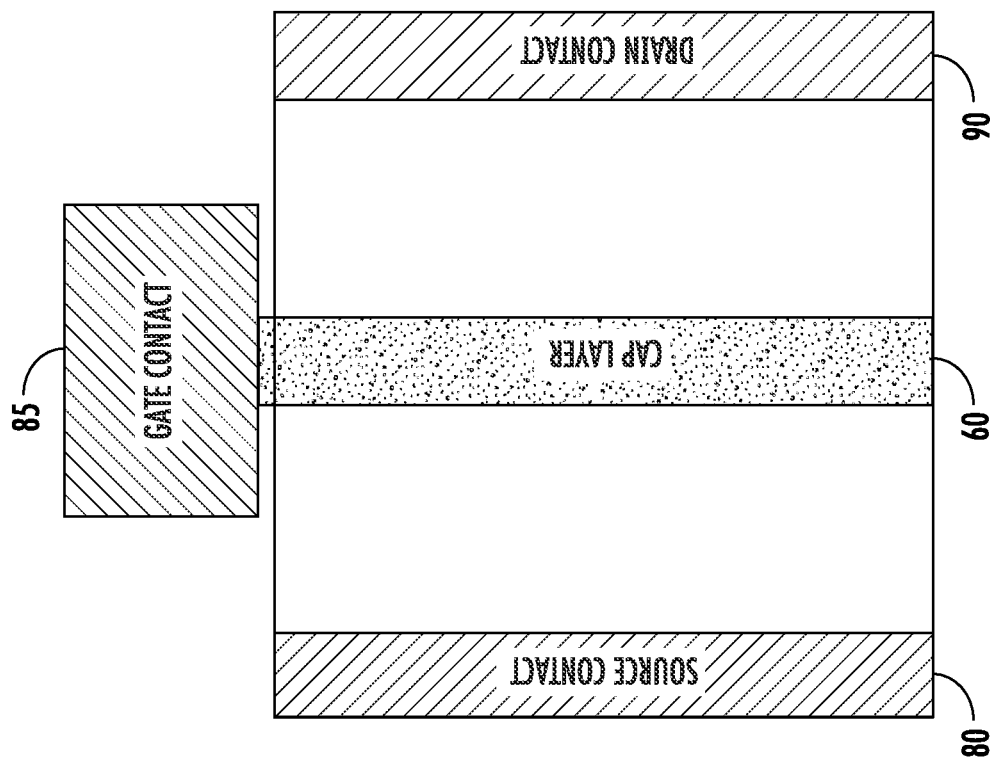
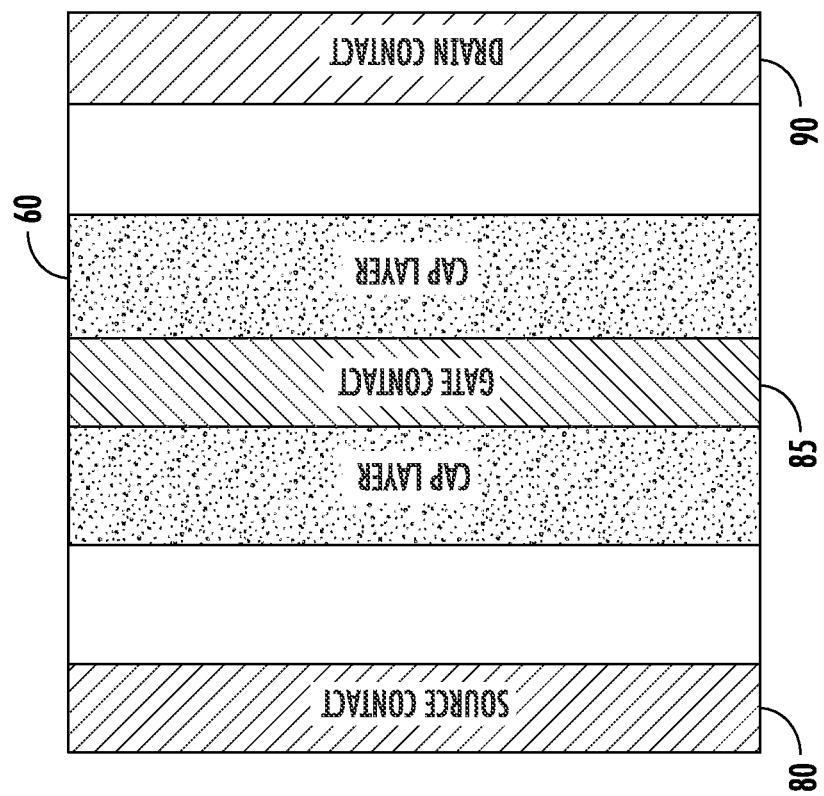

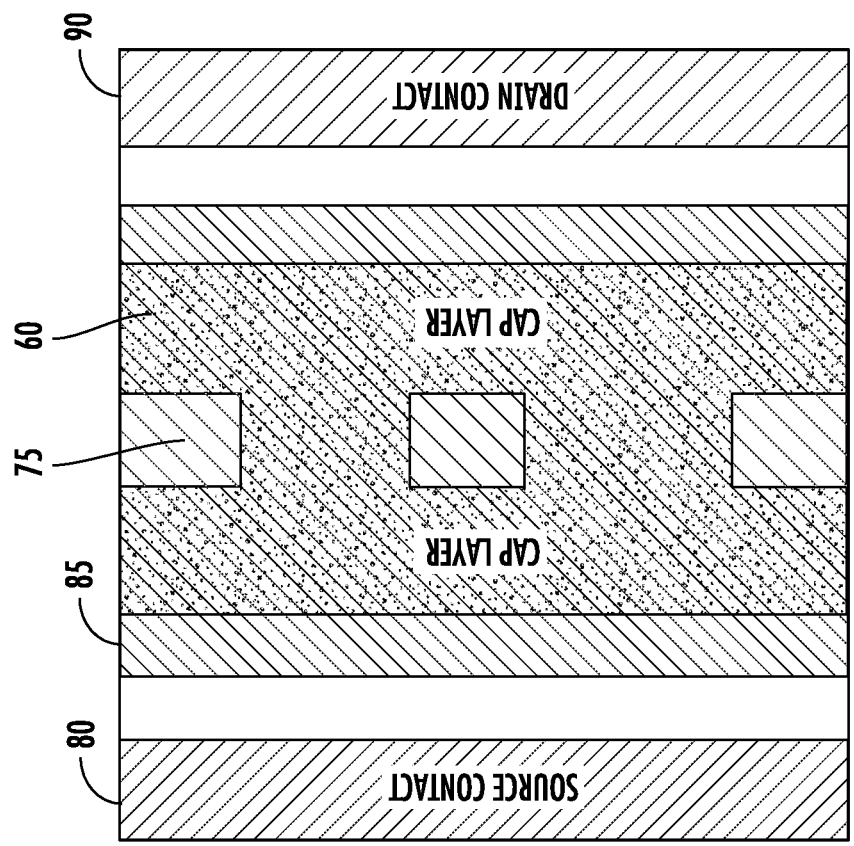
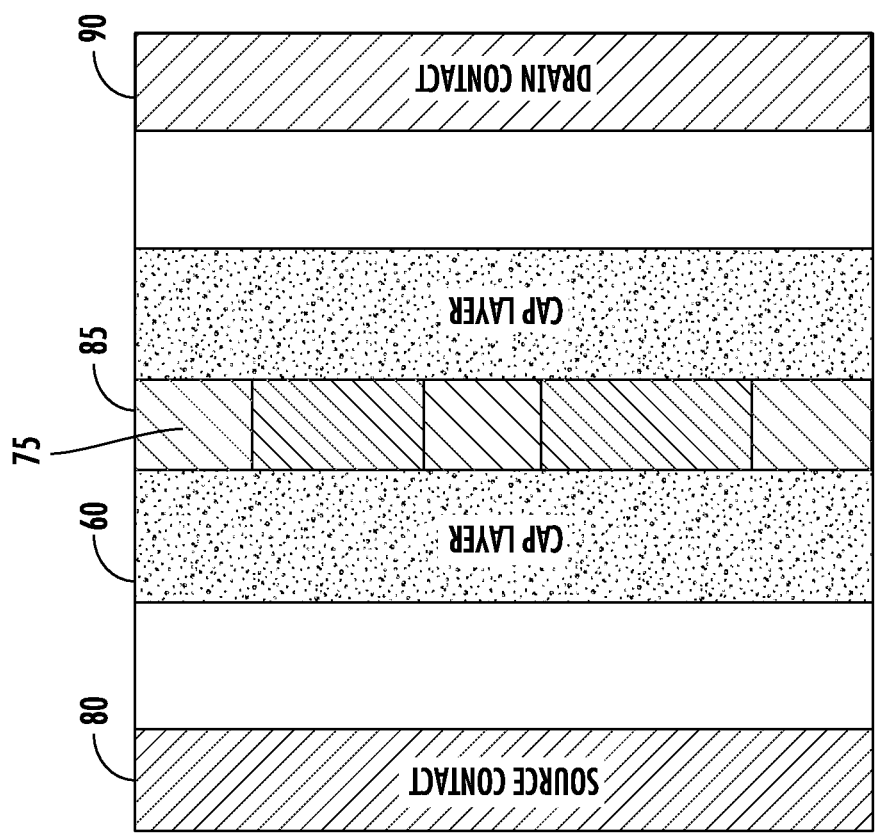

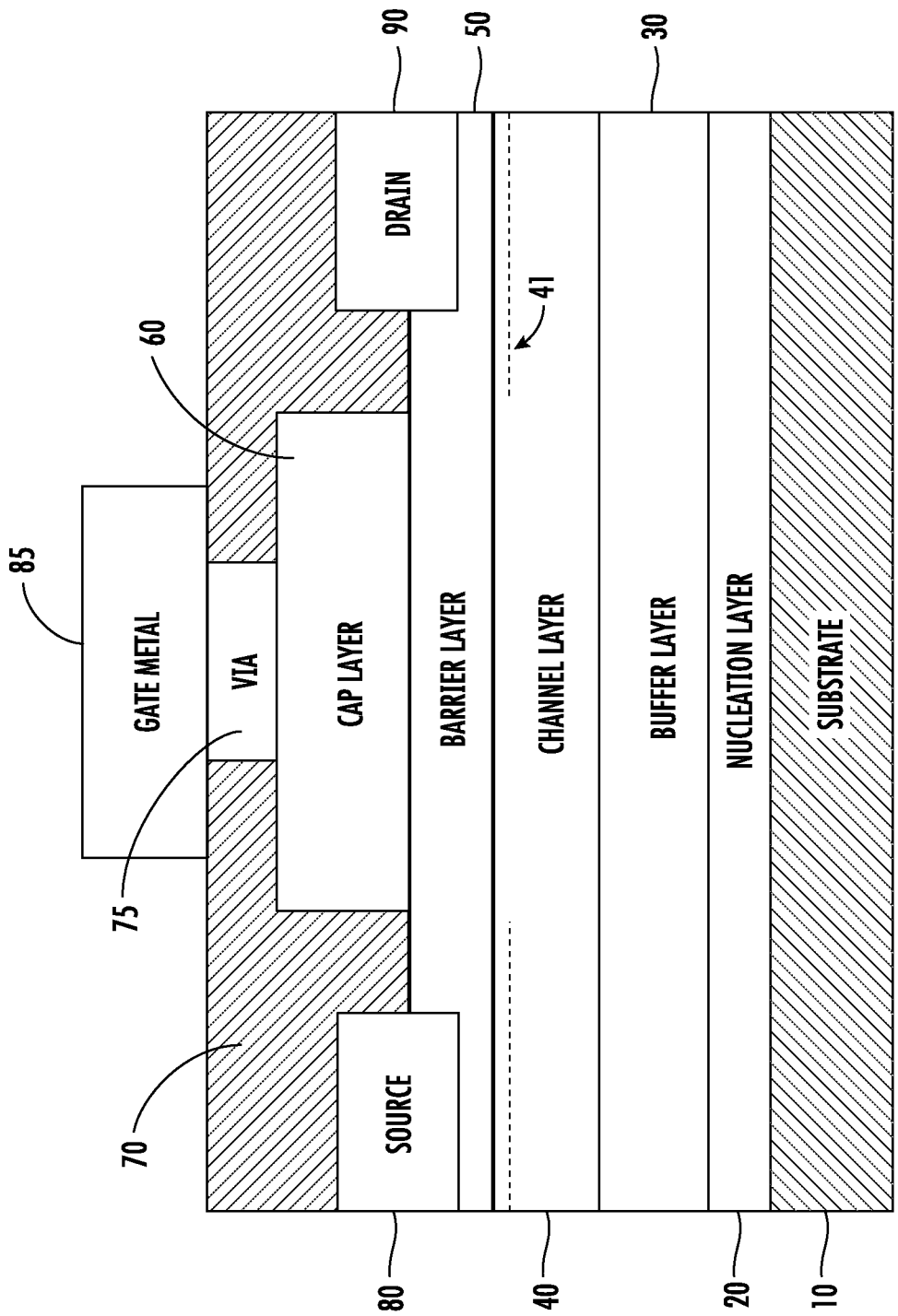

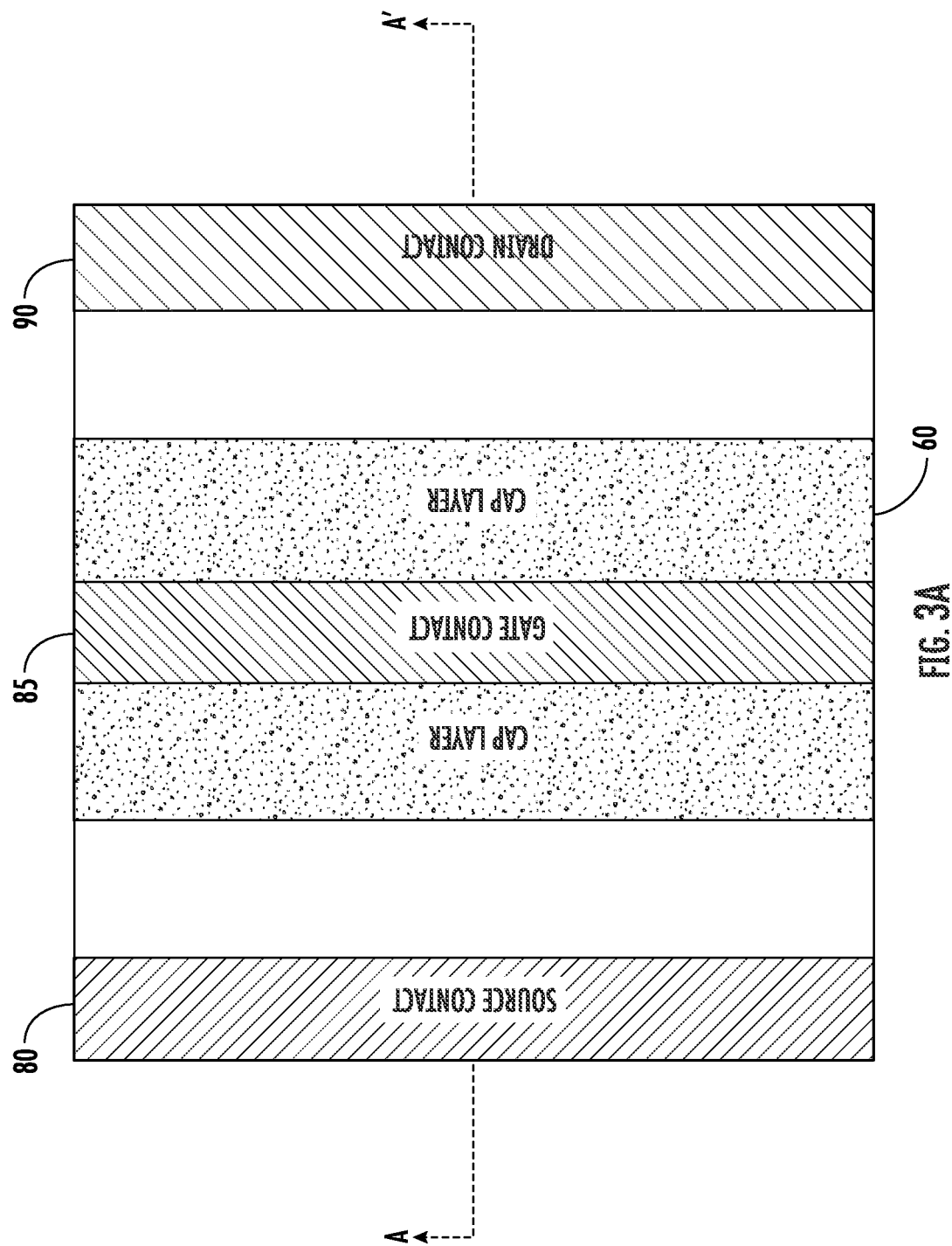

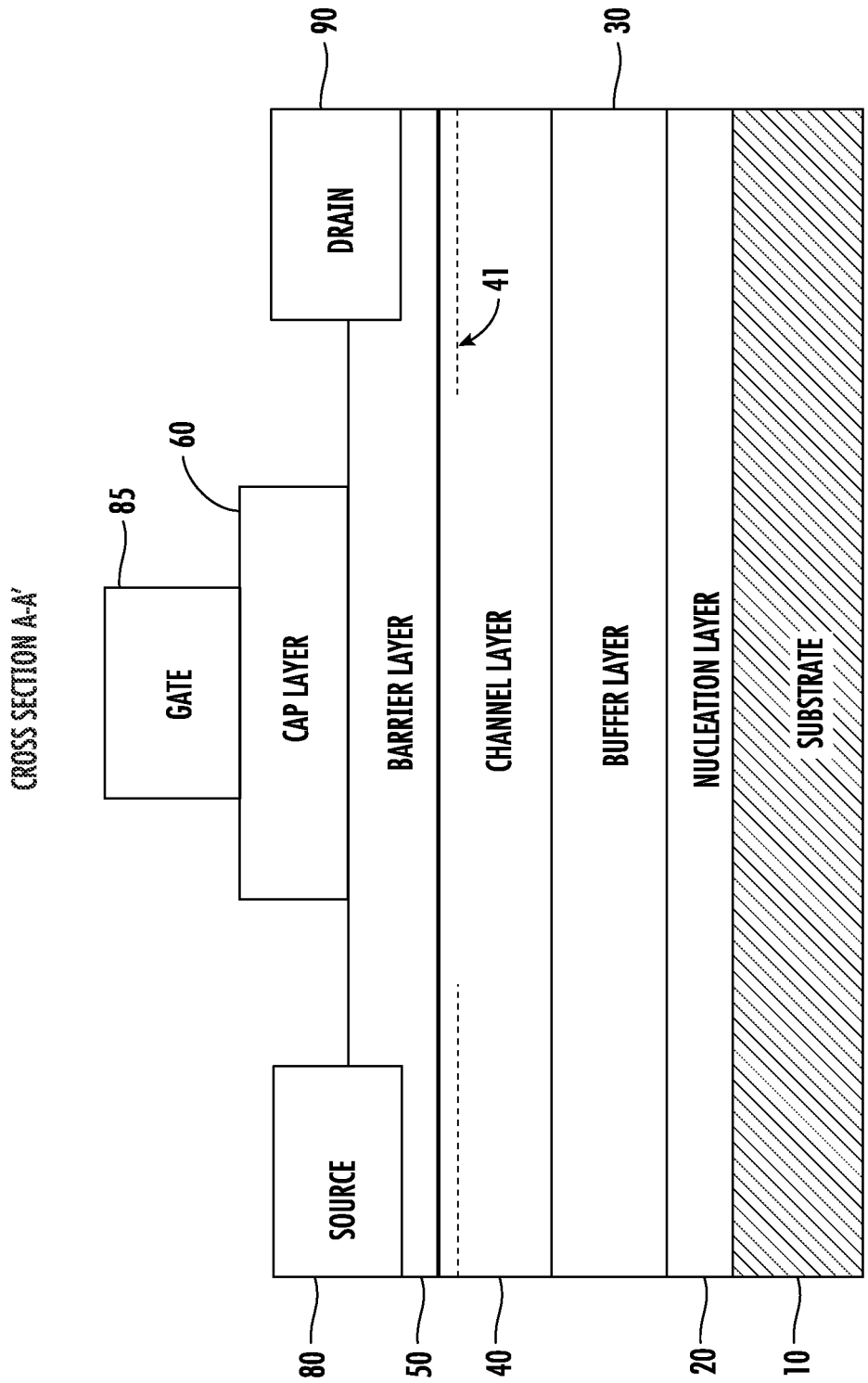

III-NITRIDE TRANSISTOR WITH A CAP LAYER FOR RF OPERATION

This application claims priority of U.S. Provisional Patent Application Ser. No. 62/981,363, filed Feb. 25, 2020 and U.S. Provisional Patent Application Ser. No. 63/041,792, filed Jun. 19, 2020, the disclosures of which are incorporated herein in their entireties.

FIELD

Embodiments of the present disclosure relate to transistor structures and methods for forming these transistor structures.

BACKGROUND

Compared with conventional power devices made of silicon, Group III-Nitride (III-N) semiconductors possess excellent electronic properties that enable the fabrication of modern power electronic devices and structures for use in a variety of applications. The limited critical electric field and relatively high resistance of silicon make currently available commercial power devices, circuits and systems constrained with respect to operating frequencies. On the other hand, the higher critical electric field and higher electron density and mobility of III-N materials allow high-current, high-voltage, high-power and/or high-frequency performance of improved power transistors.

For example, these transistors may be advantageously employed for radio frequency (RF) switching applications. The performance of RF switches, defined by the insertion loss and isolation of the switch, is governed by the on-state resistance between the source and drain terminals and off-state capacitance between these terminals.

It would be beneficial if there were a transistor structure that lowered the off-state capacitance between these terminals.

SUMMARY

This disclosure describes the structure of a transistor that provides improved performance by reducing the off-state capacitance between the source and the drain by using a cap layer to extend the electrical distance between the gate and the source and drain contacts. In certain embodiments, a dielectric layer may be disposed between the gate electrode and the cap layer and vias are created in the dielectric layer to allow the gate electrode to contact the cap layer at select locations. In some embodiments, the gate electrode is offset from the cap layer to allow a more narrow cap layer and to allow additional space between the gate electrode and the drain contact facilitating the inclusion of a field plate. The gate electrode may be configured to only contact a portion of the cap layer.

According to one embodiment, a semiconductor structure for use in a III-Nitride (III-N) semiconductor device is disclosed. The semiconductor structure comprises a channel layer; a barrier layer disposed on the channel layer, wherein electrons are formed at an interface between the channel layer and the barrier layer; a source contact and a drain contact disposed over the channel layer; a cap layer disposed between the source contact and the drain contact, and disposed above the barrier layer; and a gate electrode, wherein the gate electrode contacts a portion of the cap layer, less than an entirety of the cap layer. In certain embodiments, the cap layer comprises Mg-doped GaN, AlGaN or InGaN. In some embodiments, an active region is defined as a region between the source contact and the drain contact, and wherein the gate electrode is offset in a second direction, perpendicular to a source-drain direction. In certain embodiments, the cap layer extends in the second direction beyond the active region and at least a portion of the gate electrode is disposed outside the active region. In some embodiments, the gate electrode is directly disposed on the portion of the cap layer, wherein the cap layer extends beyond the gate electrode by at least 0.3 µm toward the source contact and/or drain contact. In some embodiments, the semiconductor structure comprises a dielectric layer disposed between the cap layer and the gate electrode, wherein a plurality of vias are disposed in the dielectric layer to allow the gate electrode to contact the cap layer in a plurality of locations. In some embodiments, the semiconductor structure comprises a dielectric layer disposed between the cap layer and the gate electrode, and at least one via disposed in the dielectric layer to allow the gate electrode to contact the portion of the cap layer, wherein the cap layer comprises a first portion extending in a second direction, perpendicular to a source-drain direction, with one or more side regions that extend from the first portion in the source-drain direction, and wherein the at least one via allows the gate electrode to contact the at least one side region. In some embodiments, the at least one side region extends toward the source contact. In certain embodiments, the gate electrode is disposed above the at least one side region. In some embodiments, a dimension of the via in the source-drain direction is greater than a dimension of the first portion in the source-drain direction. In some embodiments, the semiconductor structure comprises a field plate disposed between the gate electrode and the drain contact and disposed above the first portion of the cap layer, wherein the dielectric layer is disposed between the cap layer and the field plate. In some embodiments, the field plate does not overlap the gate electrode. In certain embodiments, the field plate is electrically connected to the source contact. In some embodiments, the portion comprises less than 90% of the cap layer.

According to another embodiment, a semiconductor structure for use in a III-Nitride (III-N) semiconductor device is disclosed. The semiconductor structure comprises a channel layer; a barrier layer disposed on the channel layer, wherein electrons are formed at an interface between the channel layer and the barrier layer; two or more source contacts and a corresponding number of drain contacts over the channel layer, wherein non-active regions are disposed between adjacent source contacts and/or adjacent drain contacts; and wherein the source contacts and corresponding drain contacts are separated by active regions; a cap layer that is disposed above the barrier layer; and a gate electrode disposed in a region between two non-active regions above the cap layer and contacting the cap layer only in the region between the two non-active regions, and wherein the cap layer extends to the active regions. In certain embodiments, the non-active regions are created by ion implantation of N, F or any other suitable species into the barrier layer and the channel layer. In some embodiments, the non-active regions are areas where the barrier layer and the channel layer have been etched. In some embodiments, the semiconductor structure comprises a dielectric layer disposed above the cap layer, wherein vias are created in the dielectric layer to allow the gate electrode to contact the cap layer in the region between the two non-active regions. In some embodiments, the semiconductor structure comprises a field plate disposed above the cap layer in the active regions. In some embodiments, the field plate is electrically connected to the source contacts.

According to another embodiment, a semiconductor structure for use in a III-Nitride (III-N) semiconductor device is disclosed. The semiconductor structure comprises a channel layer; a barrier layer, wherein electrons are formed at an interface between the channel layer and the barrier layer; a source contact and a drain contact disposed over the barrier layer; a gate electrode disposed between the source contact and the drain contact, wherein a cap layer is disposed between the gate electrode and the barrier layer; wherein the gate electrode contacts a portion of the cap layer, less than an entirety of the cap layer, such that the cap layer extends beyond the gate electrode toward the drain contact; and a field plate disposed over the cap layer between the gate electrode and the drain contact and not overlapping the gate electrode.

BRIEF DESCRIPTION OF THE FIGURES

For a better understanding of the present disclosure, reference is made to the accompanying drawings, which are incorporated herein by reference and in which:

FIG. 1 is a side view of a transistor structure according to one embodiment;

FIGS. 2A-2D show top views of four embodiments of the transistor structure of FIG. 1;

FIG. 2E is a cross-section of the transistor structure shown in FIGS. 2C-2D;

FIGS. 3A-3B show top view and cross-section views, respectively, of another embodiment of the transistor structure;

DETAILED DESCRIPTION

Figure 4A:
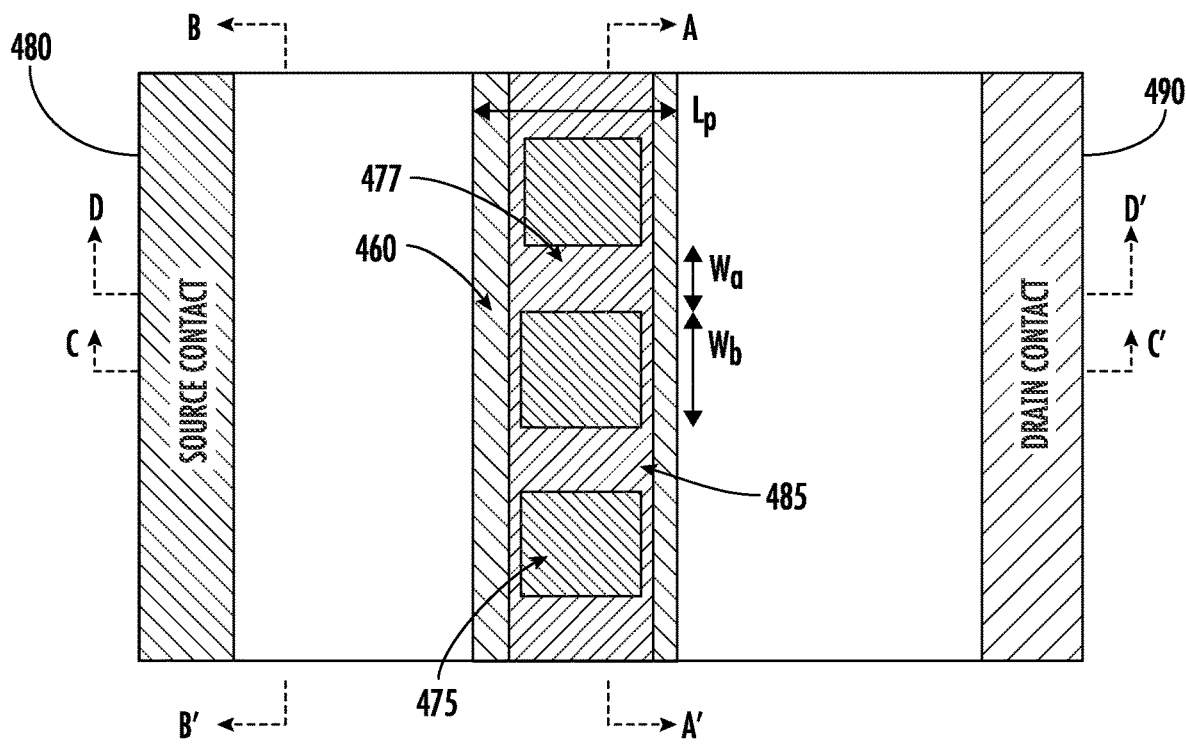
FIG. 4A shows the top view of a transistor structure according to another embodiment.

Embodiments of the present disclosure relate to transistor structure with one or more layers disposed between the barrier layer and the gate electrode. The semiconductor structures described herein may be formed of compound semiconductor materials, such as III-V semiconductor materials, and particularly Group III-Nitride (III-N) semiconductor materials.

This novel transistor structure, with one application as an RF switch, provides improved performance by reducing the off-state capacitance between the source and the drain using a cap layer to extend the electrical distance between the gate electrode and the source and drain contacts. This novel transistor structure also gives the opportunity to modify the gate capacitance, gate leakage current and the gate metal to field-plate parasitic capacitance that are not otherwise obtainable with the conventional transistor structures.

FIG. 1 shows the cross-section of the III-nitride semiconductor transistor structure 1. The transistor structure 1 comprises a substrate 10, which may be made of Si, SiC, Sapphire, III-nitride semiconductor, silicon-on-insulator, silicon-on-sapphire or any other suitable material or combination of materials.

In the case that the RF switch is fabricated on an epitaxial layer grown on a substrate 10, a nucleation layer 20 and buffer layer 30 may be present. Thus, in some embodiments, the semiconductor transistor structure 1 may include a nucleation layer 20, formed on the substrate 10. The nucleation layer 20 may include AlN.

A buffer layer 30 is formed over the nucleation layer 20. The buffer layer 30 may have a thickness between 0.5 nm and several microns. The buffer layer 30 may comprise III-nitride semiconductors including GaN, AlGaN, InGaN, InAlN, InAlGaN and AlN.

A channel layer 40 is formed over the buffer layer 30. The channel layer 40 comprises a semiconductor material selected from GaAs, InGaAs, GaN, or any other suitable semiconductor material or combination of materials.

Carriers 41, which may be free electrons, exist in the channel layer 40 to conduct electrical current between the drain contact 90 and the source contact 80.

The channel layer 40 may comprise a single layer such as a GaN layer, or multiple layers. In one example, the channel layer 40 comprises a back-barrier structure, such as a GaN layer over an AlGaN layer (GaN/AlGaN) or a GaN layer over an InGaN layer and another GaN layer (GaN/InGaN/GaN). In another example, the channel layer 40 has a superlattice structure formed by repeating a bi-layer structure of AlGaN/GaN or AlN/GaN. The thickness of the channel layer 40 may be 5 nm, although other thicknesses may be used. The thickness of the buffer layer 30 may be between zero and a few microns, although other thicknesses are within the scope of the disclosure.

A barrier layer 50 is formed over the channel layer 40. The barrier layer 50 may be made of III-nitride semiconductors selected from AlGaN, InAlN, AlN or InAlGaN. The barrier layer 50 may be un-doped, doped with Si or doped with Mg or other impurities.

The source contact 80 and the drain contact 90 are formed above the channel layer 40 and make electrical contact with the channel layer 40. The source contact 80 and drain contact 90 may be formed on the surface of the barrier layer 50, within the barrier layer 50 as shown in FIG. 1, on the surface of the channel layer 40, or within the channel layer 40. Alternatively, the source and drain regions may be further recessed and make contact to the channel layer 40 through the sides of the recess.

In this disclosure, the direction from the source contact to the drain contact is referred to as the source-drain direction or the first direction, and the direction perpendicular to the source-drain direction is referred to as the second direction.

Further, the dimension in the first direction is referred to as the first dimension and the dimension in the second direction is referred to as the second dimension. As an example, the length of the gate electrode 85, as measured in the source-drain direction, would be referred to as the first dimension. Thus, length refers to the first direction, while width refers to the second direction.

A cap layer 60 is formed over the barrier layer 50 in the region between the source contact 80 and the drain contact 90. In some embodiments, the cap layer 60 does not make contact with the source contact 80 and the drain contact 90. The gate electrode 85 is formed on the cap layer 60, making electrical contact to the cap layer 60. The gate electrode 85 contacts a portion of the cap layer 60. In certain embodiments, at least a portion of the cap layer 60 is larger than the length of the gate electrode 85 and is not in direct contact with the gate electrode 85. In other words, the cap layer 60 may be larger in the first direction than the gate electrode 85. The gate electrode 85 can modulate the carrier density (which may be electrons or holes) in the channel layer 40 under the cap layer 60 through its electrical contact with the cap layer 60. That is, despite making contact with only a portion of the cap layer 60, the gate bias can increase or decrease the carrier density in the entire channel layer 40 underneath the cap layer 60 through its electrical contact with the cap layer 60. In the on-state, the active region underneath the cap layer 60 has carriers 41 that can flow between the source contact 80 and drain contact 90. In the off-state, the active region underneath the cap layer 60 is depleted of carriers 41.

The cap layer 60 may be made of a conductive material such as a doped or undoped semiconductor material, polycrystalline material, conductive oxide or nitride, metal or any other suitable material or combination of suitable materials. The cap layer material is selected such that the gate to drain and/or gate to source capacitance in off-state is smaller at high frequencies (for example, over 10 MHz) than at low frequencies (less than 10 Hz). In one embodiment, the cap layer 60 is a Mg-doped p-type III-nitride semiconductor layer (i.e., p-type GaN) having a thickness ranging from 10 nm to more than 200 nm and Mg doping density ranging from $1E17/cm^3$ to more than $5E19/cm^3$.

The cap layer 60 is electrically connected to the gate electrode 85, and intentionally extends farther than the minimum achievable length beyond the gate electrode 85 in the direction parallel and/or perpendicular to the gate. As shown in FIG. 1, in the off-state, the carriers 41 in the channel layer 40 will be reduced under the cap layer 60.

Top-down view schematics of four embodiments of this transistor are shown in FIGS. 2A-2D.

In FIG. 2A, the gate electrode 85 makes direct contact with the cap layer 60 over the entire second dimension of the device, and the cap layer 60 extends beyond the gate electrode 85 in the first direction towards both the source contact 80 and the drain contact 90. In certain embodiments, the cap layer 60 extends at least 0.3 µm in each direction.

In FIG. 2B, the cap layer 60 extends beyond the gate electrode 85 along the second dimension, which is perpendicular to the first direction. In other embodiments, the cap layer 60 may extend beyond the gate electrode 85 in more than one direction. For example, the active region is defined as the region between the source contact 80 and the drain contact 90, and extends in the second direction. In certain embodiments, the gate electrode 85 is offset in the second direction, such that it is not centered in the active region. In other embodiments, such as that shown in FIG. 2B, the gate electrode 85 is disposed outside the active region. In yet other embodiments, a portion of the gate electrode 85 may be disposed outside the active region, while a second portion is disposed within the active region.

In the embodiments shown in FIGS. 2C and 2D, a dielectric layer 70 is deposited on top of the cap layer 60 and vias 75 are used to connect the gate electrode 85 to the cap layer 60 in specific regions. In certain embodiments, the vias 75 may be between 10 nm and 100 µm. The dielectric layer 70 may be SiN, $SiO_2$, $SiO_xN_y$, or any other suitable dielectric. This is best shown in FIG. 2E.

In FIG. 2C, the gate electrode 85 may be physically smaller than the cap layer 60 in the first direction. In FIG. 2D, the gate electrode 85 may be physically larger than the cap layer 60 in the first direction. In FIG. 2D, while the gate electrode 85 is physically larger than the cap layer 60 in the first direction, it makes limited contact with the cap layer 60 through vias 75. In this embodiment, the cap layer 60 extends beyond the vias 75 in the first direction towards the source contact 80 and drain contact 90 along the device width.

FIG. 2E is a cross-section of the transistors shown in FIGS. 2C and 2D. In both embodiments, the dielectric layer 70 may be disposed between the gate electrode 85 and the cap layer 60 to separate these two components. Vias 75 pass through the dielectric layer 70 and connect the gate electrode 85 to the cap layer 60 at selected locations. In certain embodiments, the dielectric layer 70 may cover the entirety of the barrier layer 50 and optionally cover part of all of the source contact 80 and drain contact 90. The dielectric layer 70 only needs to physical separate the gate electrode 85 from the cap layer 60. In both embodiments, the cap layer 60 may extend beyond the vias 75 in one or more directions.

The cap layer 60 shown in FIGS. 2A-2E may have areas outside of the active region in some embodiments. The gate electrode 85 may also have areas outside of the active region. The active region is defined as the region that allows current flow between the drain contact 90 and the source contact 80.

In other embodiments, one or more field plates are included, which may be electrically connected to the gate electrode 85 or to the source contact 80. These field plates may extend beyond the gate electrode 85.

The use of a cap layer 60 between the gate electrode 85 and the barrier layer 50 may reduce off-state capacitance.

Example 1

FIGS. 3A-3B show an example embodiment formed using III-nitride semiconductor materials. The top view of the transistor is shown in FIG. 3A, and is similar to the embodiment shown in FIG. 2A. In this example, the cap layer 60 extends beyond the gate electrode 85 in the first direction towards the source contact 80 and drain contact 90. In certain embodiments, the cap layer 60 extends at least 0.3 µm in each direction. In other embodiments, the cap layer 60 may extend at least 0.3 µm in at least one direction. FIG. 3B shows the cross-section of the transistor structure along the cutline A-A'. The transistor comprises a substrate 10 made of Si, SiC, Sapphire, III-nitride semiconductor or any other suitable material. A nucleation layer 20 is formed over the substrate 10. The nucleation layer 20 may include AlN. A buffer layer 30 is formed over the nucleation layer 20. A channel layer 40 is formed over the buffer layer 30. The buffer layer 30 and channel layer 40 comprise III-nitride semiconductor materials including GaN, AlGaN, InGaN, InAlN, InAlGaN and AlN. Carriers 41, such as free electrons, exist near the surface of the channel layer 40 to conduct electrical current between the source contact 80 and drain contact 90.

A barrier layer 50 is formed over the channel layer 40. The barrier layer 50 is made of III-nitride semiconductors selected from AlGaN, InAlN, AlN or InAlGaN. The barrier layer 50 may have sub-layers such as an AlN sub-layer in contact with the channel layer and an AlGaN sub-layer over the AlN sub-layer.

Above the barrier layer 50 is the cap layer 60. This cap layer 60 may be made of Mg-doped GaN with a doping density ranging from $1E17/cm^3$ to more than $5E19/cm^3$, another doped or un-doped semiconductor material, or any other suitable material. The cap layer 60 may be grown in the same process as the epitaxial growth as the other III-nitride materials, or grown or deposited in a later process.

In the embodiment shown in FIGS. 3A-3B, an AlGaN barrier layer 50 is formed over a GaN channel layer 40. Carriers 41, which may be free electrons, are formed at the interface between the AlGaN barrier layer 50 and the GaN channel layer 40. The cap layer 60 is formed by GaN doped with Mg and depletes the electrons in the channel layer 40 underneath the cap layer 60 while in the off-state. The transistor shown in FIGS. 3A-3B is normally-off because the cap layer 60 fully depletes the carriers 41 in the channel layer 40 with no bias voltage applied. In another embodiment, a normally-on transistor can be formed by selecting a cap layer 60 material that does not fully deplete the carriers 41 in the channel layer 40.

The gate electrode 85 is formed over the cap layer 60. In this example, the gate electrode 85 makes electrical contact with the cap layer 60 directly forming a Schottky contact. In another embodiment, the gate electrode 85 may make ohmic contact to the cap layer 60. Note that since the gate electrode 85 is much thinner in the first direction than the cap layer 60, the gate electrode 85 only contacts a portion of the cap layer 60.

In this example, the source contact 80 and drain contact 90 are formed by partially recessing the barrier layer 50. In other embodiments, the source contact 80 and drain contact 90 may be on the surface of the barrier layer 50, or the barrier layer 50 may be fully recessed with the source contact 80 and drain contact 90 located at the surface or within the channel layer 40. The source contact 80 and drain contact 90 may also be formed on heavily doped regrown ohmic regions in the channel layer 40. Thus, in certain embodiments, the source contact 80 and the drain contact 90 are over the barrier layer 50. In other embodiments, the source contact 80 and the drain contact are over the carrier layer 40.

In this embodiment, the cap layer 60 is intentionally extended beyond the gate electrode 85 on both source and drain sides by 20 nm-10 um or more. There may be a gap of 20 nm-10 um or more between the cap layer 60 and the source contact 80 and drain contact 90. In other embodiments, the cap layer 60 only extends on either the source or drain side.

In this example, no field plates are used. In another embodiment, one or more field plates are formed over the region between the gate electrode 85 and drain contact 90. In some embodiments, one or more field plates are also formed between gate electrode 85 and source contact 80. These field plates may be connected to the gate electrode 85 or the source contact 80.

In other embodiments, the cap layer 60 may be formed by Mg-doped GaN, AlGaN or InGaN semiconductors with a thickness ranging from 2 nm to over 200 nm. The barrier layer 50 is made of III-nitride semiconductors including AlGaN, AlN, InAlN, GaN, InGaN, or InAlGaN. In one example, the barrier layer 50 has a sub-layer made of AlGaN which has a thickness between 1 nm and 20 nm and Al composition ranging between 5% and 100%. In another example, the barrier layer 50 has a few sub-layers such as an AlGaN layer over an AlN layer, or an AlN layer over an AlGaN layer. The channel layer 40 is made of GaN, InGaN, AlGaN or a combination of the material forming a multi-layer structure such as a super-lattice structure or a back-barrier structure. The band-gap of the barrier layer 50 in immediate contact with the channel layer 40 is larger than that of the channel layer 40 in immediate contact with the barrier layer 50.

The gate electrode 85, source contact 80 and drain contact 90 may be made of a material selected from Ni, Au, Ti, Al, TiN, W, WN, Pt, Cu, Mo and any other suitable material or combination of materials.

Example 2

In another example, silicon is selected as the channel layer material for the transistor. In this example, the substrate 10 is silicon-on-insulator (SOI), silicon-on-sapphire (SOS), silicon, or any other suitable material. The channel layer 40 may be doped with one carrier type, or may include one or more wells of different doping type formed by diffusion, ion implantation, or another suitable process. The contact regions in this example are defined by heavily doping the silicon using ion implantation, followed by a metal silicide process to form ohmic contacts. In other embodiments, source contact 80 and drain contact 90 may be formed by any other suitable process.

In this example, the device structure is the same as shown in FIGS. 3A-3B. In other embodiments, the device structure may be selected from any of the structures shown in FIGS. 2A-2E or any other structure such that the cap layer 60 extends beyond the gate electrode 85 or the via connections 75 to the gate electrode 85 in one or more directions.

In this example, the channel layer 40 is formed with phosphorous-doped silicon, resulting in free electrons in the channel. A cap layer 60 made of boron doped polysilicon is then formed on the surface. The doping density is selected such that in the off-state, the carriers 41 under the cap layer 60 are fully depleted, but the capacitance between the cap layer 60 and source and drain regions at radio frequencies is low. In other embodiments, the doping of the channel layer 40 and cap layer 60 may be different, or the cap layer 60 may be formed from another suitable material.

In an embodiment where the transistor utilizes silicon, the fabrication may follow a standard silicon CMOS process flow and may include other features of standard CMOS transistors, including self-aligned channel implants using a spacer on the cap layer 60. The main differences between this transistor and a conventional RF switch implemented in silicon are the selection of material for the cap layer 60 and doping such that it has low RF capacitance and the extension of the cap layer 60 with respect to the gate electrode 85 in one or more directions.

Example 3

Figure 4B:
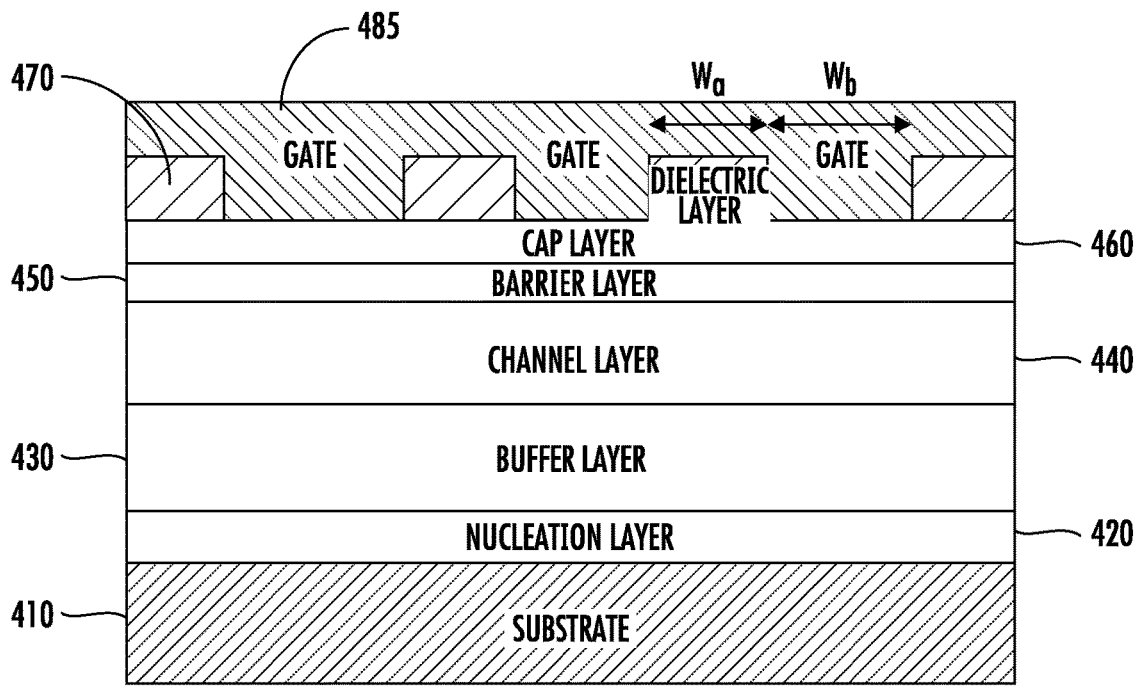
FIGS. 4B-4E show cross-section views of the transistor structure of FIG. 4A taken along lines A-A', B-B', C-C' and D-D', respectively.
Figure 4C:
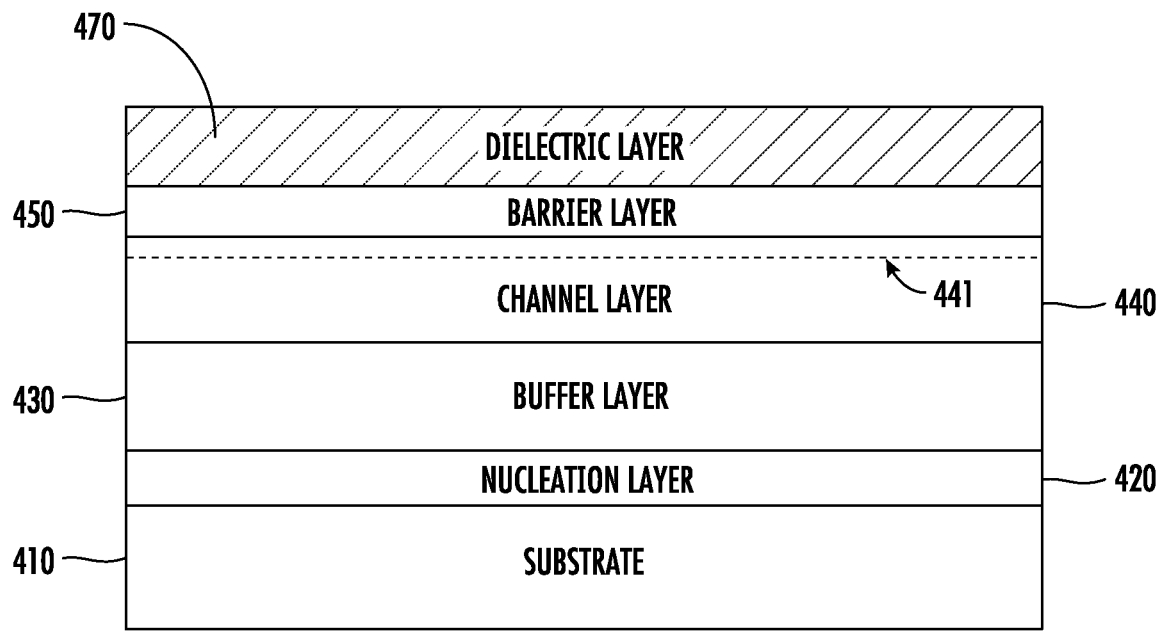
Figure 4D:
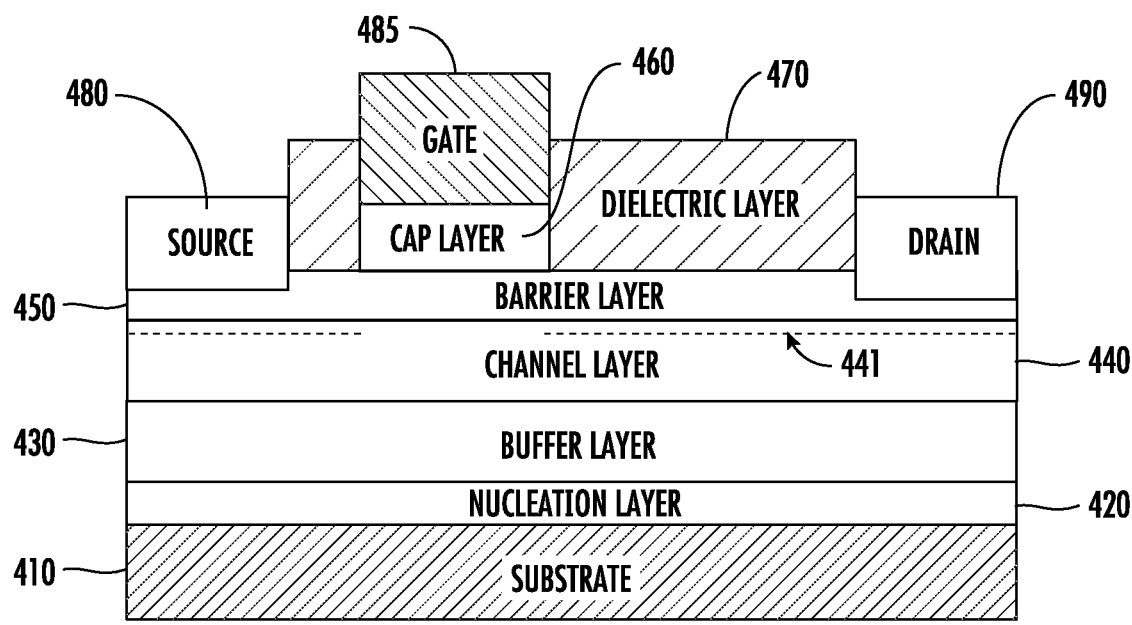
Figure 4E:
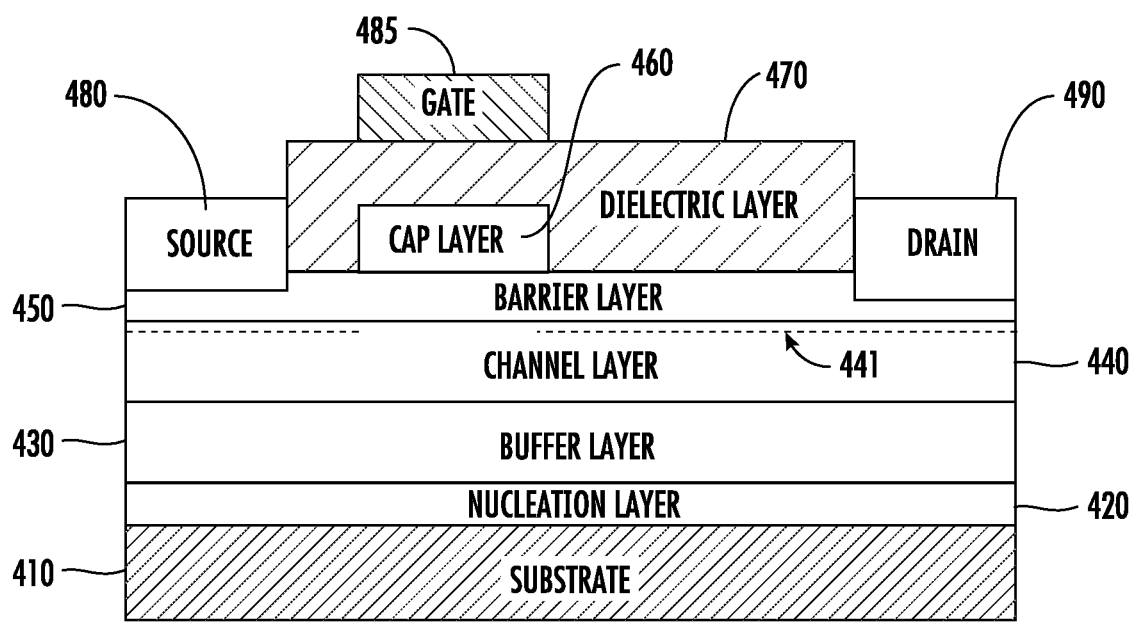

FIGS. 4A-4E show another example embodiment formed using III-nitride semiconductor materials. The top view of the transistor structure is shown in FIG. 4A and is similar to that shown in FIGS. 2C-2D. The cross-section along line A-A' is shown in FIG. 4B. The cross-section along line B-B' is shown in FIG. 4C. The cross-section along line C-C' is shown in FIG. 4D. The cross-section along line D-D' is shown in FIG. 4E.

The transistor is a normally-off GaN-based transistor with the channel layer 440 comprising GaN semiconductor material. The transistor conducts current through a 2-dimensional electron gas (2DEG) formed at the interface between a barrier layer 450 comprising AlGaN and the channel layer 440. Of course, a normally-on transistor may also be formed.

As best seen in FIGS. 4B-4E, the transistor comprises a substrate 410 made of Si, SiC, Sapphire, III-nitride semiconductor or any other suitable material. A nucleation layer 420 is formed over the substrate 410. The nucleation layer 420 may include AlN. A buffer layer 430 is formed over the nucleation layer 420. A channel layer 440 is formed over the buffer layer 430. The buffer layer 430 and channel layer 440 comprise III-nitride semiconductors including GaN, AlGaN, InGaN, InAlN, InAlGaN and AlN. Carriers 441, such as free electrons in the form of a 2DEG, exist in the channel layer 440 to conduct electrical current between the drain contact 490 and source contact 480. The channel layer 440 may have a single layer such as a GaN layer or multiple layers. In one example, the channel layer 440 has a back-barrier structure such as a GaN layer over an AlGaN layer (GaN/AlGaN) or a GaN layer over an InGaN layer and another GaN layer (GaN/InGaN/GaN). In another example, the channel layer 440 has a superlattice structure formed by repeating a bi-layer structure of AlGaN/GaN or AlN/GaN. A barrier layer 450 is over the channel layer 440. The barrier layer 450 is made of III-nitride semiconductors selected from AlGaN, InAlN, AlN and InAlGaN with Al percentage ranging from 0 to 100%. The barrier layer 450 may have multiple sublayers. For example, the barrier layer 450 may have AlGaN and AlN sublayers. The barrier layer 450 may be doped with Silicon or undoped.

A cap layer 460 is formed over the barrier layer 450 only in the gate region. The gate region is defined as the region between the source contact 480 and the drain contact 490, typically where the gate electrode 485 is to be disposed.

The cap layer 460 is a p-type III-nitride semiconductor doped with Mg or other suitable dopants. In certain embodiments, the Mg doping density in the cap layer 460 ranges from $1E17/cm^3$ to $1E21/cm^3$. The cap layer 460 forms a built-in potential with the channel layer 440 underneath. The cap layer 460 may have a rectangular shape that extends across the second direction of the device.

A dielectric layer 470 is deposited over the cap layer 460 in the gate region and over the barrier layer 450 outside the gate region. The dielectric layer 470 can be $Si_xN_y$, $SiO_2$, $SiO_xN_y$, $Al_2O_3$, AlN and any other suitable insulating material with a thickness ranging from 1 nm to over 200 nm.

In the gate region, a portion 475 of the dielectric layer 470 is recessed to expose the cap layer 460. Thus, in recessed portion 475 in FIG. 4A, the dielectric layer 470 is open and the gate electrode 485 contacts the cap layer 460 directly. In other covered regions 477, the dielectric layer 470 is intact and the gate electrode 485 is deposited over the dielectric layer 470. The width of the recessed portion 475 is $W_b$, ranging from 10 nm to over fpm. The distance between each recessed portion 475 in the dielectric layer 470 is $W_a$ ranging from 10 nm to over fpm. The ratio, $W_a/(W_a+W_b)$, ranges from 5% to 95%. The length (dimension in the first direction in FIG. 4A, along D-D' line) of the recessed portion 475 can be less, equal or larger than the length of the cap layer ($L_p$). The gate electrode 485 is formed on top of the dielectric layer 470 and contacts the cap layer 460 via the recessed portions 475. The length of the gate electrode 485 can be less, equal or larger than the length of the cap layer $L_p$. The gate electrode 485 may be made of materials selected from Ti, Al, TiN, W, WN, Ni, Au, Pt, ploy-silicon and any other suitable conductive material. The source contact 480 and drain contact 490 are formed by recessing the dielectric layer 470 and forming ohmic metal contact via the recessed area. The ohmic metal is made of materials selected from Ti, Al, TiN, W, WN, Ni, Au, Pt, ploy-silicon and any other suitable conductive material but often different from the metal used for the gate electrode 485.

Note that in the cross-section shown in FIG. 4E, which corresponds to covered regions 477, the gate electrode 485 does not contact the cap layer 460. The gate electrode 485 on the transistor extends over the edge of dielectric opening and in some cases over the edge of cap layer 460 to the drain side forming a gate field plate. It is possible to have multiple field-plates which extend over the drain-side edge of the gate electrode 485 where the second field-plate is over a thicker dielectric than the gate field plate.

Example 4

Figure 5A:
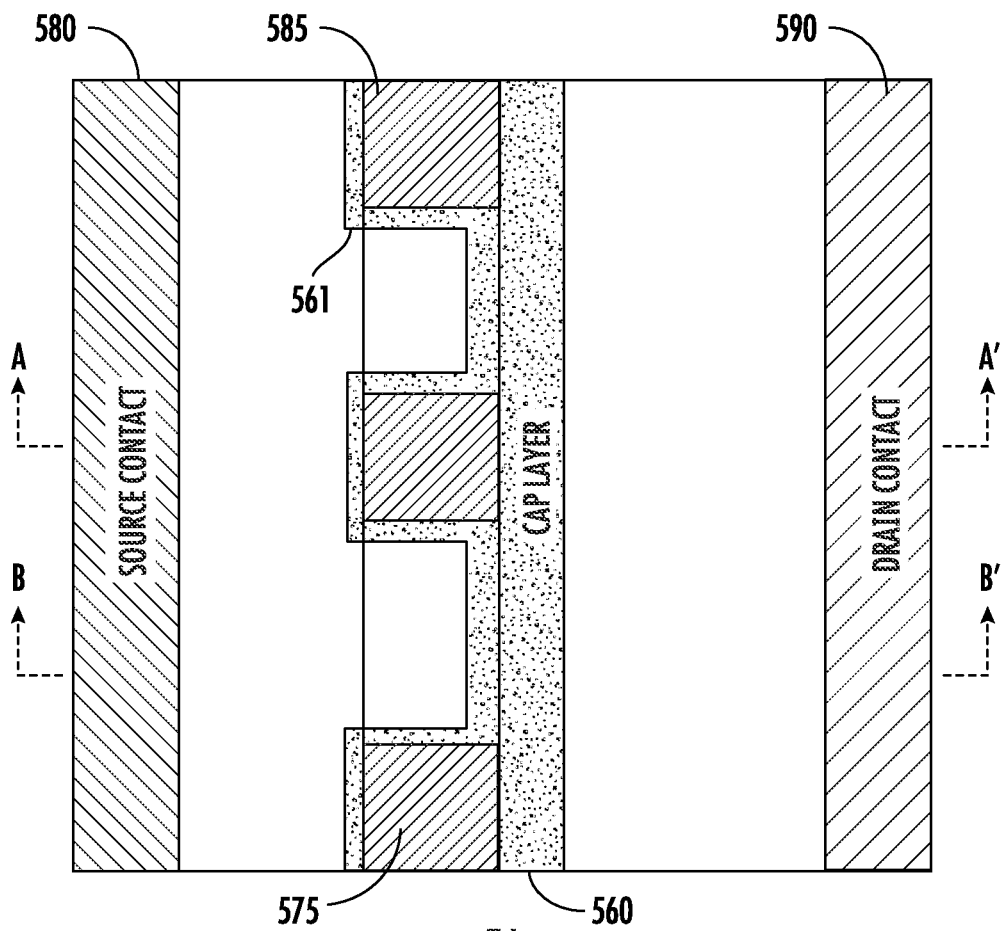
FIG. 5A shows a top view of a transistor structure according to another embodiment.
Figure 5B:
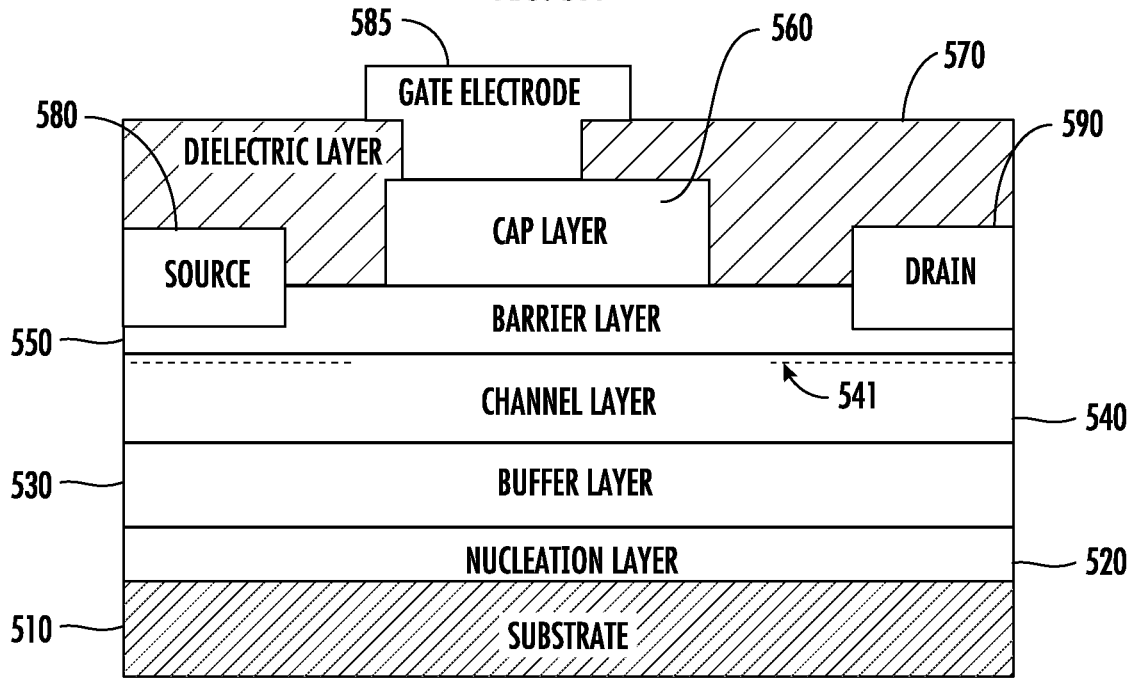
FIGS. 5B-5C show cross-section views of the transistor structure of FIG. 5A, taken along lines A-A' and B-B', respectively.
Figure 5C:
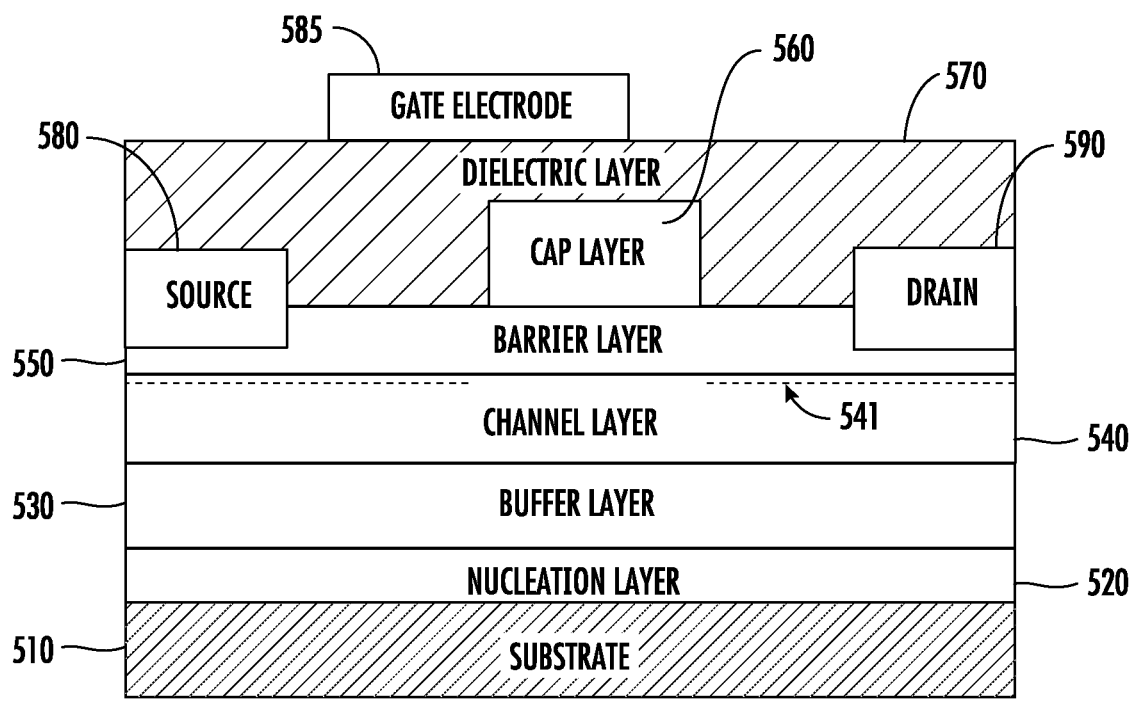

FIGS. 5A-5C show another example embodiment formed using III-nitride semiconductor materials. The top view of the transistor structure is shown in FIG. 5A. The cross-section along line A-A' is shown in FIG. 5B. The cross-section along line B-B' is shown in FIG. 5C.

The transistor is a normally-off GaN-based transistor, comprising a substrate 510, a nucleation layer 520, a buffer layer 530, a channel layer 540, a barrier layer 550, a cap layer 560 and a dielectric layer 570. The composition of these various layers in the transistor structure may be the same as described above with respect to the previous example. As described above, a source contact 580 and a drain contact 590 may be in ohmic contact with the channel layer 540, such that carriers 541 pass from the source contact 580 to the drain contact 590 by passing through the active region. Of course, in other embodiments, the transistor may be a normally-on transistor.

In this embodiment, vias 575 may pass through the dielectric layer 570 to allow the gate electrode 585 to directly contact the cap layer 560. The cap layer 560 may have a first portion that traverses the active region in the second direction, perpendicular to the source-drain direction. As shown in the figure, this first portion may be rectangular. However, in other embodiments, the first portion may be other shapes such as zig-zag, hexagonal or other shapes. Additionally, the cap layer 560 may have side regions 561 that extend from the first portion toward the source contact 580. In other embodiments, the side regions 561 may extend toward the drain contact 590. These side regions 561 may be slightly larger than the vias 575 such that the gate electrode 585 is ensured to contact the cap layer 560. In certain embodiments, the side regions 561 are separate from one another, such that the dielectric layer 570 is disposed between adjacent side regions 561. Since the vias 575 are associated with the side regions 561, the length of the first portion in the first dimension is not limited by the vias 575. Thus, the length of the first portion of the cap layer 560 may be narrower than the vias 575 in some embodiments.

In certain embodiments, the gate electrode 585 is disposed above the side regions 561 and does not cover all of the first portion of the cap layer 560. In some embodiments, the gate electrode 585 does not cover any of the first portion. In other embodiments, the gate electrode 585 is disposed over the entire cap layer 560 or a portion of the cap layer 560, contacting the cap layer 560 only through the vias.

FIG. 5B shows a cross-section of the transistor along line A-A'. As this cross-section passes through one of the side regions 561, the gate electrode 585 is in contact with the cap layer 560.

FIG. 5C shows a cross-section of the transistor along line B-B'. As this cross-section does not pass through one of the side regions 561, the gate electrode 585 is not in contact with the cap layer 560. Rather, the dielectric layer 570 covers the cap layer 560 and separates the cap layer 560 from the gate electrode 585.

Thus, in this embodiment, the cap layer 560 is not disposed below the entirety of the gate electrode 585 though the entire second dimension of the device. In other words, the first portion of the cap layer 560 is offset from the gate electrode 785 in the first direction in this embodiment.

Further, while FIG. 5A shows the gate electrode 585 as a rectangular member, it is understood that metal that connects the vias 575 may be various shapes and sizes.

Further, while FIG. 5A shows side regions 561, in another embodiment, the cap layer 560 may be a large rectangular portion, where the gate electrode 585 is offset from the cap layer 560 in the first direction so that part of the cap layer 560 is not covered by the gate electrode 585. For example, the embodiment of FIG. 4A may be modified to have the cap layer 460 extend further toward the drain contact 490.

Example 5

Figure 6A:
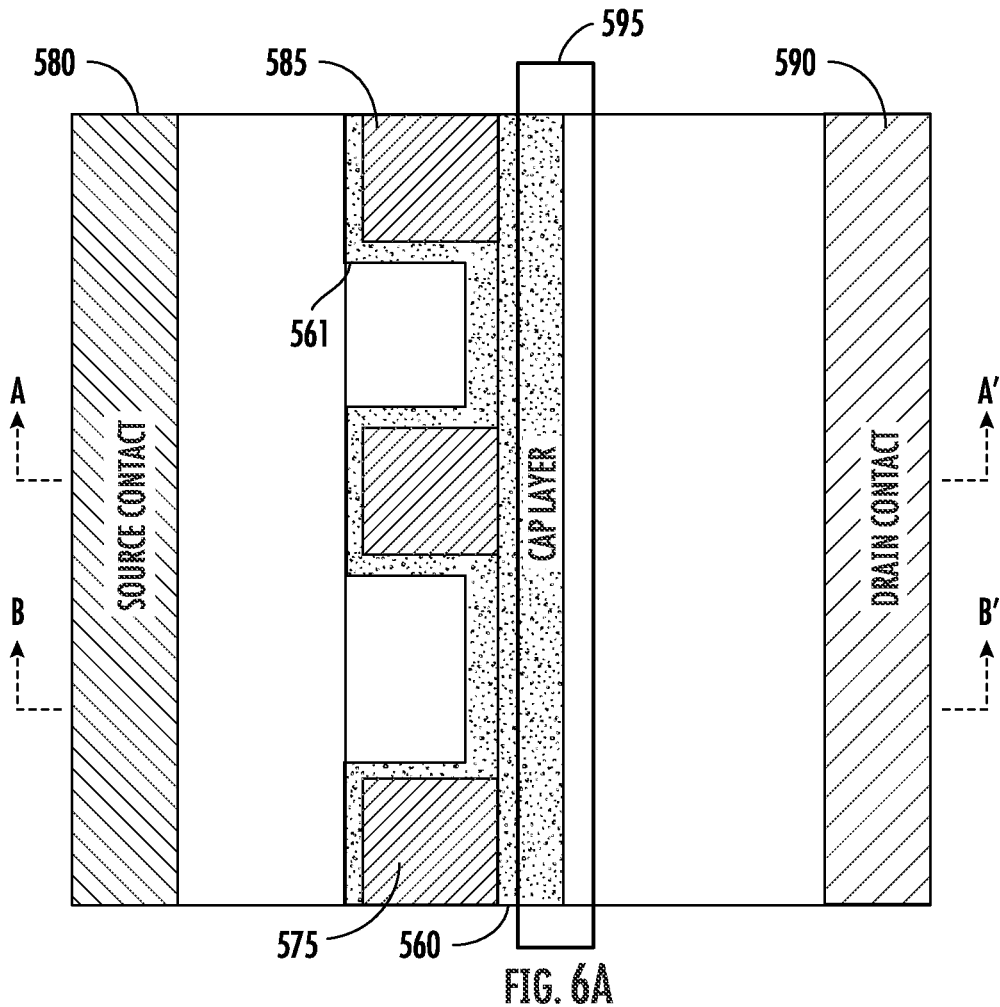
FIG. 6A shows an embodiment of the transistor structure of FIG. 7A with a source connected field plate.
Figure 6B:
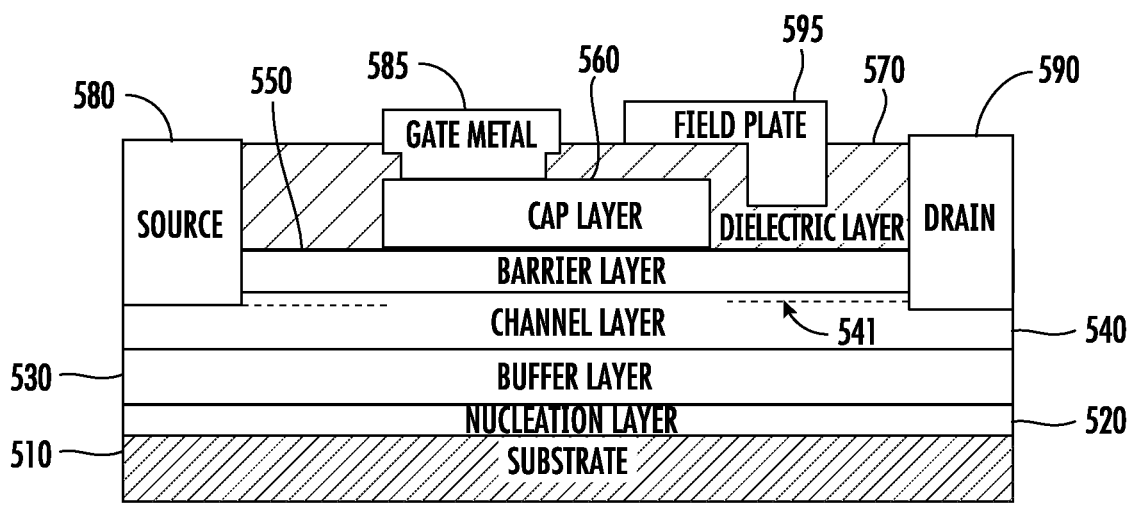
FIGS. 6B-6C show cross-section views of the transistor structure of FIG. 6A, taken along lines A-A' and B-B', respectively.
Figure 6C:
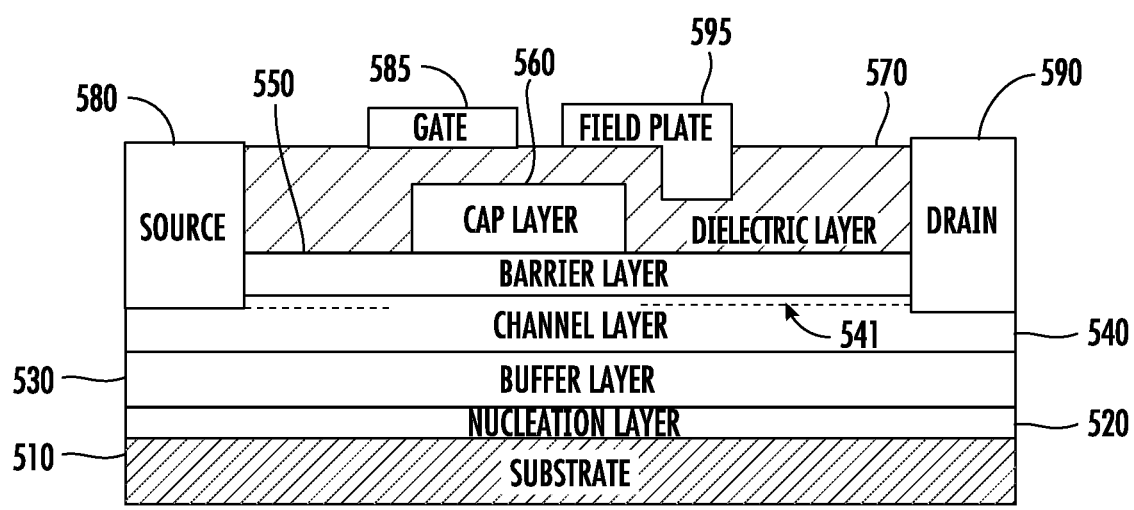

FIG. 6A-6C shows a modification to the transistor structure shown in FIGS. 5A-5C. The top view of the transistor structure is shown in FIG. 6A. The cross-section along line A-A' is shown in FIG. 6B. The cross-section along line B-B' is shown in FIG. 6C. Components with similar functions have been given identical reference designators as were used in FIGS. 6A-6C.

In this embodiment, the fact that the cap layer 560 is offset from the gate electrode 585 in the first direction allows the inclusion of a field plate 595, which may be connected to the source contact 580. In this embodiment, the gate electrode 585 covers only the side regions 561 of the cap layer 560 and the field plate 595 also covers only a portion of the cap layer 560. As shown in these figures, the gate electrode 585 covers the portion of the cap layer 560 that is disposed closer to the source contact 580. Further, the field plate 595 does not overlap the gate electrode 585. Additionally, the field plate 595 covers the drain-side edge of the cap layer 560. Thus, the gate electrode 585 covers the side regions 561 while the field plate 595 covers the first portion of the cap layer 560.

The field plate 595 may be made of the same materials as are used for the source contact 580, the drain contact 590, the gate electrode 585 or the interconnect metal formed after the gate, source and drain formation.

Additionally, FIGS. 6B-6C show the source contact 580 and the drain contact 590 recessed so as to contact the channel layer 540. Note that this configuration can apply to any of the embodiments described herein.

Example 6

Figure 7A:
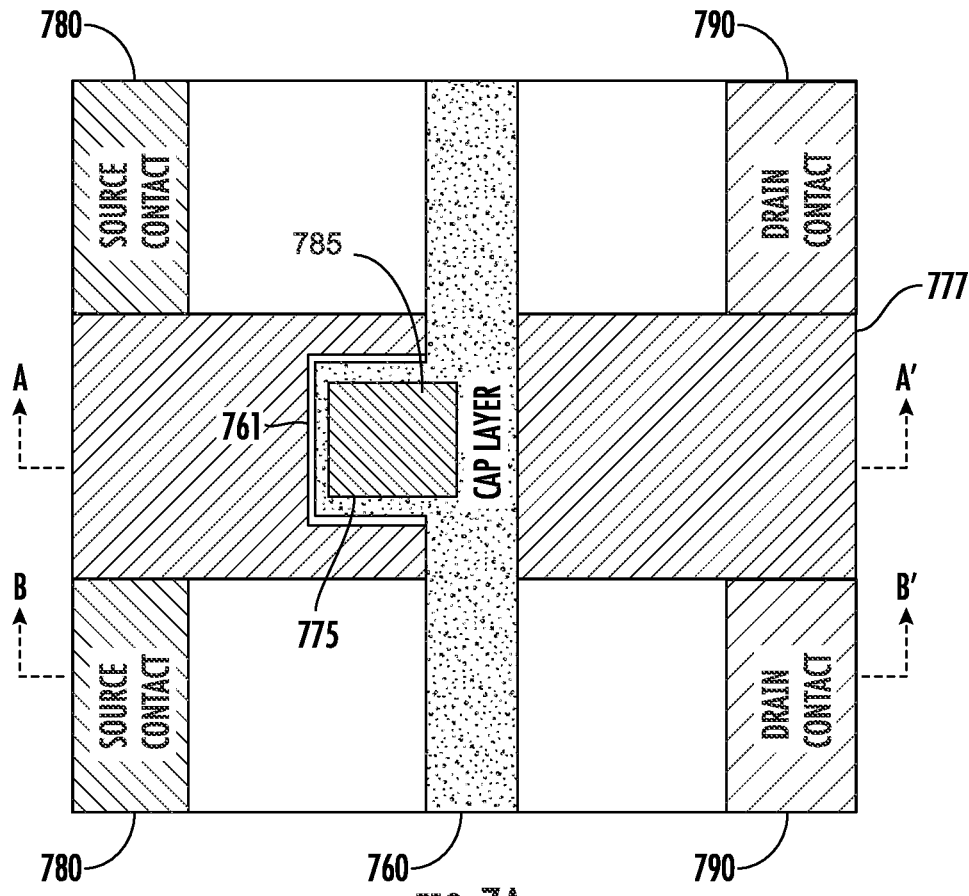
FIG. 7A shows a top view of a transistor structure according to another embodiment.
Figure 7B:
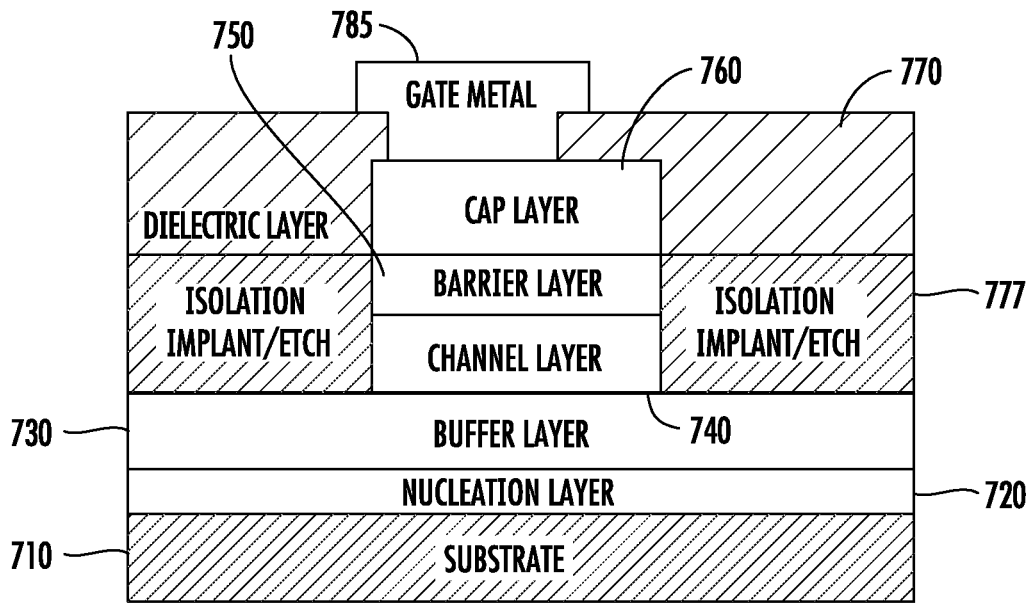
FIGS. 7B-7C show cross-section views of the transistor structure of FIG. 7A, taken along lines A-A' and B-B', respectively.
Figure 7C:
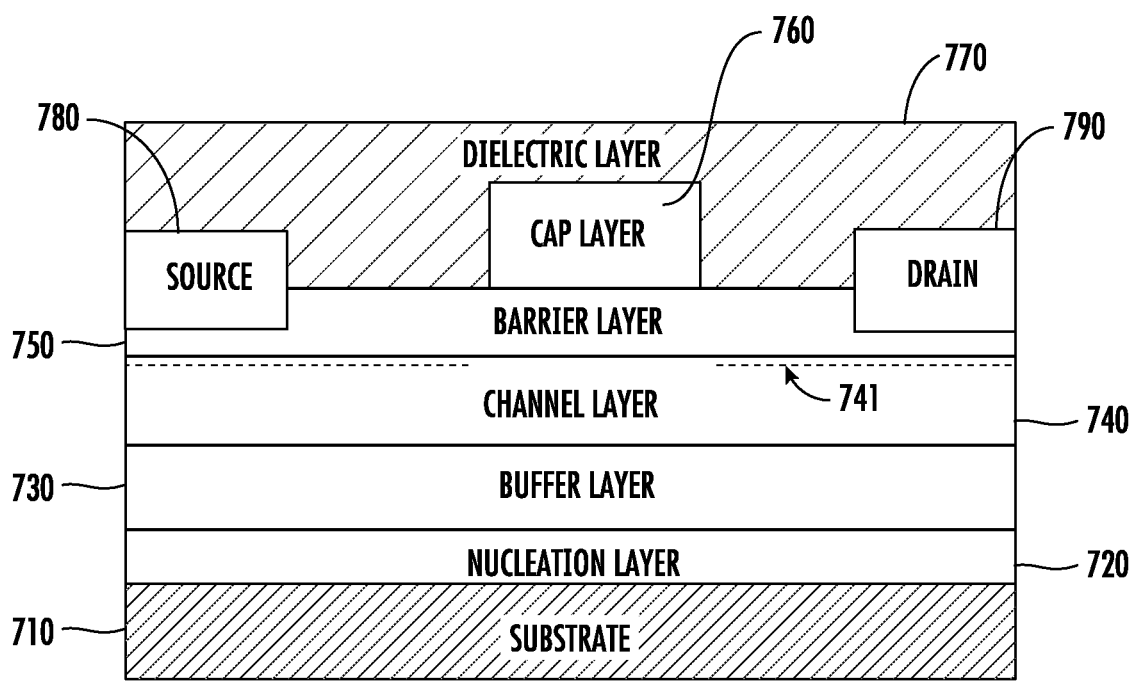

FIGS. 7A-7C show another example embodiment formed using III-nitride semiconductor materials. The top view of the transistor structure is shown in FIG. 7A. The cross-section along line A-A' is shown in FIG. 7B. The cross-section along line B-B' is shown in FIG. 7C.

The transistor is a normally-off GaN-based transistor, comprising a substrate 710, a nucleation layer 720, a buffer layer 730, a channel layer 740, a barrier layer 750, a cap layer 760 and a dielectric layer 770. The composition of these various layers in the transistor structure may be the same as described above with respect to the previous examples. As described above, a source contact 780 and a drain contact 790 may be in ohmic contact with the channel layer 740, such that carriers 741 pass from the source contact 780 to the drain contact 790 by passing through the active region. Of course, the transistor may be a normally-off transistor, if desired.

In this embodiment, vias 775 may pass through the dielectric layer 770 to allow the gate electrode 785 to contact the cap layer 760. The cap layer 760 may have a first portion that traverses the active region in the second direction. This first portion may be rectangular, or may be another shape. Additionally, the cap layer 760 may have a side region 761 that extends toward the source contact 780. In other embodiments, the side region 761 may extend toward the drain contact 790. This side region 761 may be slightly larger than the via 775 such that the gate electrode 785 is ensured to contact the cap layer 760. In certain embodiments, the side region 761 is located at a location between the two opposite ends of the cap layer 760. In this way, the cap layer 760 extends from the side region 761 in both directions along the second direction.

In certain embodiments, the gate electrode 785 is disposed above the side region 761 and does not cover the first portion of the cap layer 760.

Further, unlike the previous examples, the present transistor has two active regions, which are separated by a non-active region 777, where current does not flow. Thus, this configuration is similar to that shown in FIG. 2B, where a plurality of those structures are arranged in parallel.

The non-active region 777 may be created by ion implantation of N, F, or any other suitable species into the barrier layer 750 and the channel layer 740. In other embodiments, the non-active region 777 is an area where the barrier layer 750 and the channel layer 740 have been etched. The two source contacts 780 may be connected using a metal interconnect (not shown). Similarly, two drain contacts 790 may be connected using a metal interconnect (not shown). Active regions are formed between each source contact 780 and its corresponding drain contact 790. In this embodiment, the cap layer 760 extends to these two active regions. However, the gate electrode 785 only contacts the cap layer 760 in the region between the two active regions. In other words, the gate electrode 785 contacts the cap layer 760 in the region that has non-active regions 777 on both sides in the first direction.

FIG. 7B shows a cross-section of the transistor along line A-A'. As this cross-section passes through the side region 761, the gate electrode 785 is in contact with the cap layer 760. Further, the non-active regions 777 are visible in this cross-section.

FIG. 7C shows a cross-section of the transistor along line B-B'. As this cross-section does not pass through the side region 761, thus, the gate electrode 785 is not present. Rather, the dielectric layer 770 covers the cap layer 760. Since the cap layer 760 is doped, the carriers 741 beneath the cap layer 760 are depleted in the off state.

Thus, in this embodiment, the gate electrode 785 is only disposed above a small amount of the cap layer 760 and the cap layer 760 extends in both directions along the second direction.

Further, while FIG. 7A shows a single side region 761 that is surrounded by two active regions, this embodiment is not limited to this embodiment. For example, there may be a greater number of active regions, wherein each adjacent pair of active regions is separated by a non-active region 777 that includes a side region 761 with a via 775 for connection to the gate electrode 785.

Further, while FIG. 7A shows non-active regions 777 between the two source contacts 780 and between the two drain contacts 790, in other embodiments, the non-active regions 777 may be disposed between only the source contacts 780 or the drain contacts 790. Furthermore, in some embodiments, the non-active regions 777 may not separate the source contacts 780 and/or drain contacts 790. Rather, the non-active regions 777 may be between the source contacts 780 and/or drain contacts 790, but may not completely separate these contacts. For example, a single source contact 780 may be utilized, with a non-active region 777 disposed between the source contact 780 and the cap layer 760. Similarly, a single drain contact 790 may be utilized, with a non-active region 777 disposed between the drain contact 790 and the cap layer 760. Thus, in these embodiments, the gate electrode 785 is disposed in a region between two active regions above the cap layer 760 and contacting the cap layer 760 only in the region between the two active regions.

Example 7

Figure 8A:
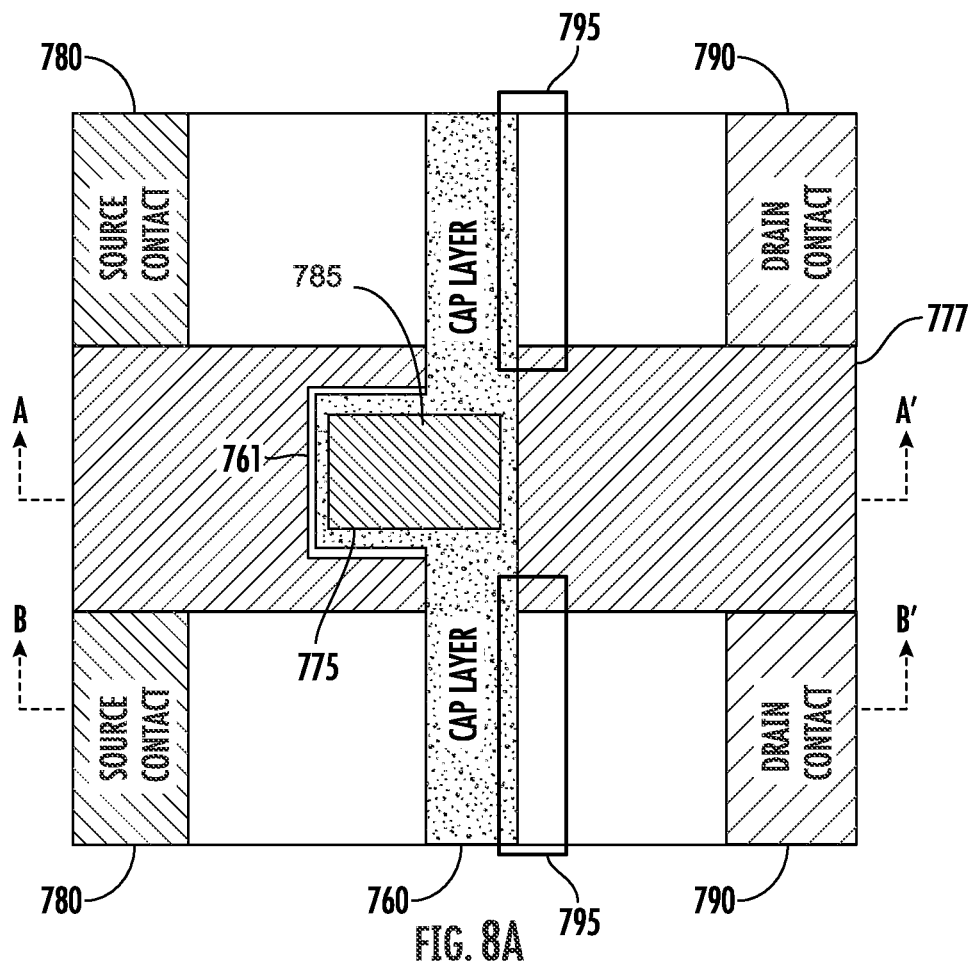
FIG. 8A shows an embodiment of the transistor structure of FIG. 7A with a source connected field plate.
Figure 8B:
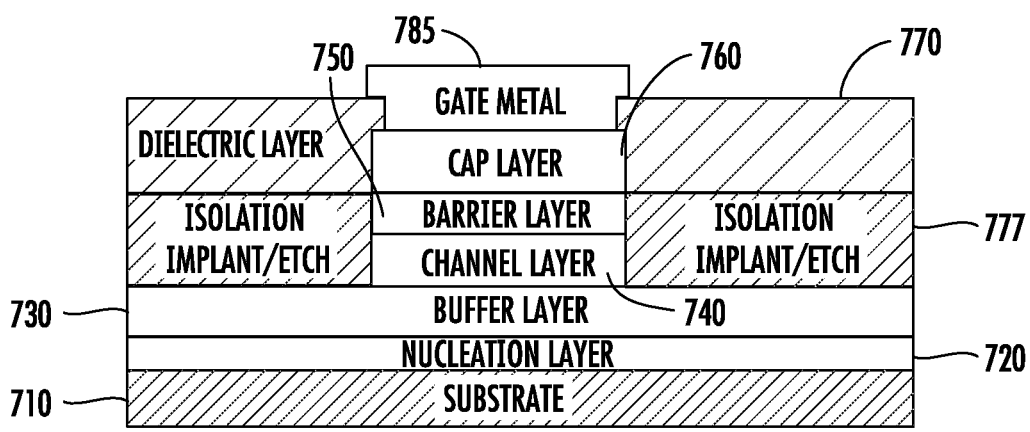
FIGS. 8B-8C show cross-section views of the transistor structure of FIG. 8A, taken along lines A-A' and B-B', respectively.
Figure 8C:
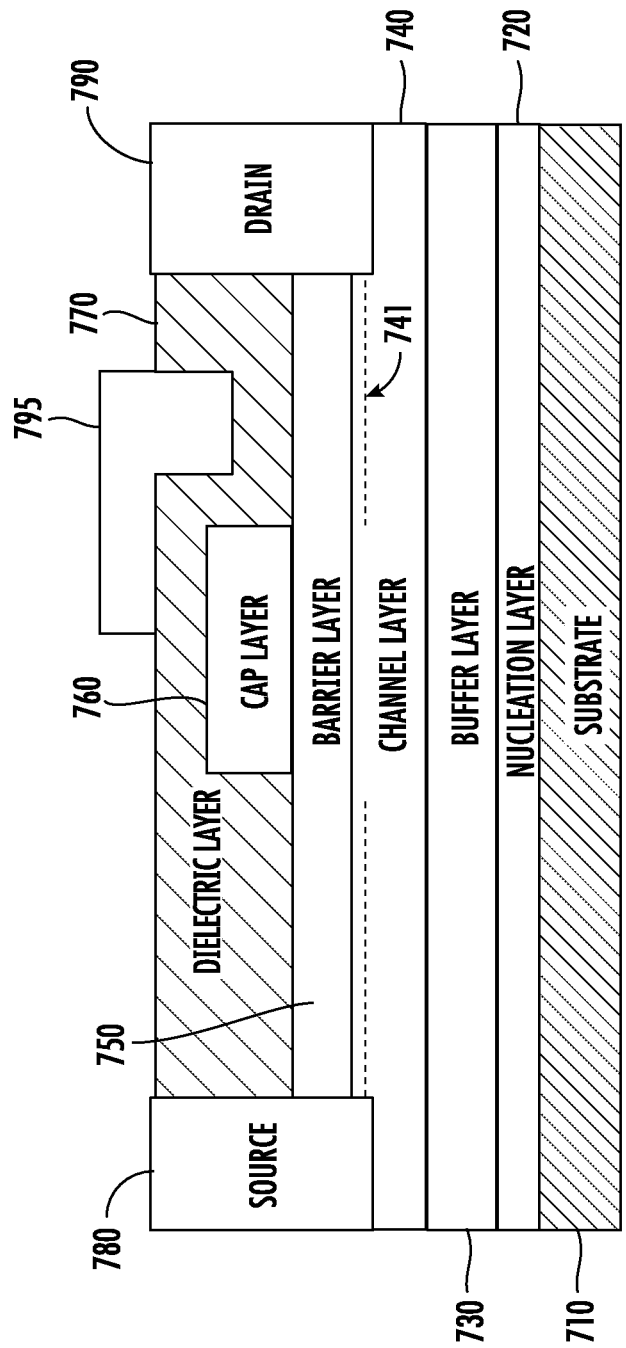

FIG. 8A-8C shows a modification to the transistor structure shown in FIGS. 7A-7C. The top view of the transistor structure is shown in FIG. 8A. The cross-section along line A-A' is shown in FIG. 8B. The cross-section along line B-B' is shown in FIG. 8C. Components with similar functions have been given identical reference designators as were used in FIGS. 7A-7C.

In this embodiment, the fact that the gate electrode 785 only covers a small portion of the cap layer 760 allows the inclusion of two field plates 795, which each may be connected to the source contact 780. In this embodiment, the gate electrode 785 covers only a portion of the cap layer 760 and the field plates 795 also cover only a portion of the cap layer 760. As shown in these figures, the gate electrode 785 covers the portion of the cap layer 760 that is disposed closer to the source contact 780. Further, the field plates 795 do not overlap the gate electrode 785. In another embodiment, the field plates 795 covers both the source-edge and drain-edge of the cap layer 760 in the active regions.

The field plates 795 may be made of the same materials as are used for the source contact 780, the drain contact 790, the gate electrode 785 or the interconnect metal formed after the gate, source and drain formation.

Additionally, while all of the embodiments illustrated herein show a dielectric layer that is flat, it is understood that the dielectric layer may also be conformally deposited.

Figure 9:
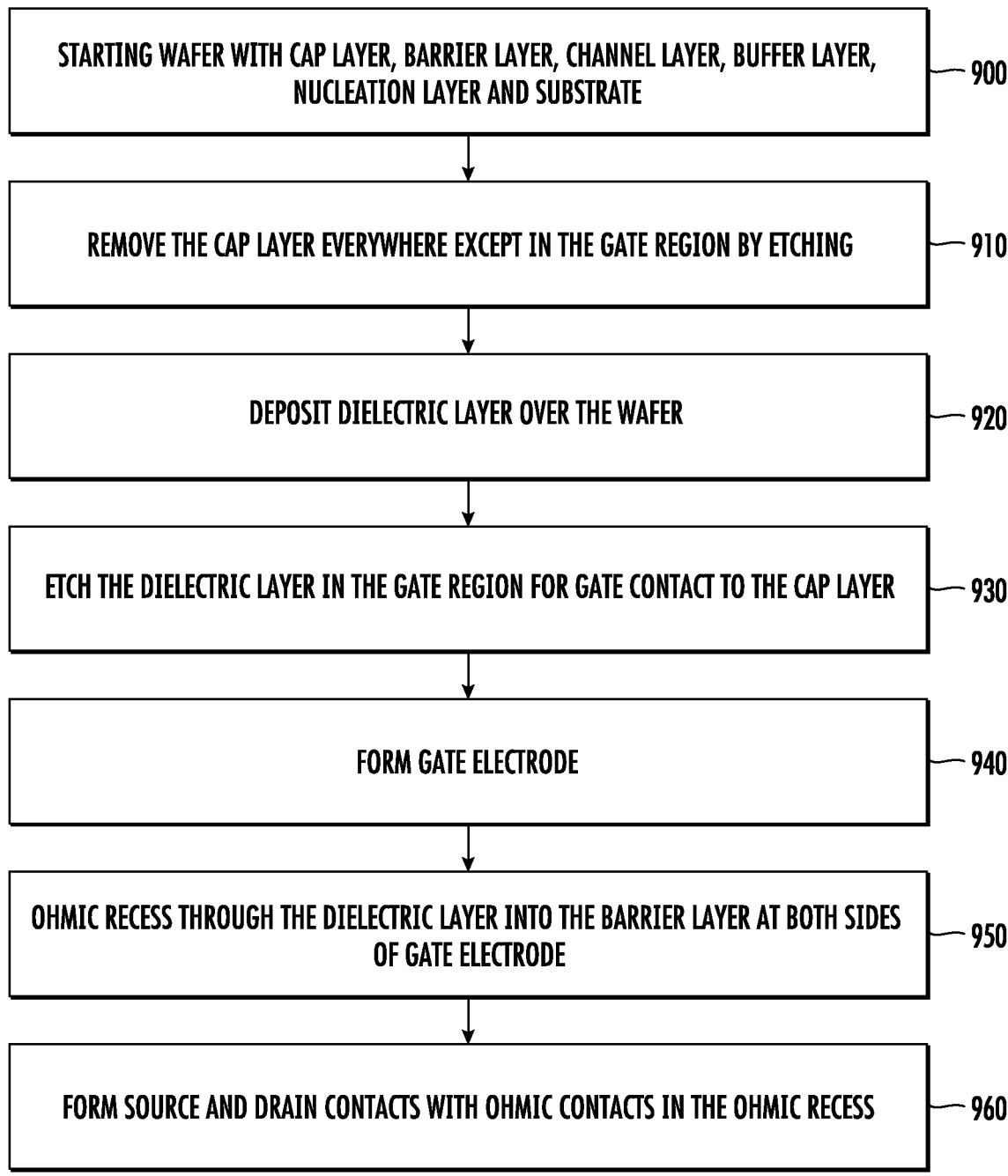
FIG. 9 shows a flowchart that illustrates the processes to create the transistor structure shown in any of these embodiments.

An example of fabricating the transistor shown in the figures is shown in FIG. 9. First, as shown in Box 900, a wafer comprising a substrate, a nucleation layer, a buffer layer, a channel layer, a barrier layer and a cap layer is formed, such as through the use of epitaxial growth or another suitable method. In certain embodiments, the cap layer is then removed except for in the gate region, as shown in Box 910. In certain embodiments, such as those shown in FIGS. 4-8, a dielectric layer is then deposited on the wafer, as shown in Box 920. As shown in Box 930, the dielectric layer is then etched in the gate region to form the recessed portions. The dielectric layer in the recessed portions is completely removed such that the cap layer is exposed. Next, as shown in Box 940, the gate electrode is formed in the gate region. Next, ohmic recesses are formed through the dielectric layer into the barrier layer 5 on both sides of the gate electrode, as shown in Box 950. Finally, as shown in Box 960, the source contact and drain contact are formed in the ohmic recesses.

The sequence of forming the gate electrode, the source contact and the drain contact can be changed. For example, source and drain contacts may be formed before the formation of the gate electrode. Further, for the embodiment shown in FIGS. 3A-3B, Boxes 920, 930 and 960 may be omitted. Additional process steps not shown here may include depositing additional dielectric layers, forming field plates, vias and interconnections.

The embodiments described above in the present application may have many advantages. In all embodiments, the gate electrode contacts only a portion of the cap layer, less than the entirety of the cap layer. In certain embodiments, the portion is less than 90% of the cap layer. In other embodiments, the portion is less than 75% of the cap layer. In yet other embodiments, the portion is less than 50% of the cap layer.

By having the gate electrode contacting only a portion of a cap layer, the off-state capacitance of the device may be reduced. For example, off-state capacitance may be related to the contact area between the gate electrode and the cap layer. By reducing this contact area, off-state capacitance is reduced. Further, by implementing the side regions, as shown in FIGS. 5A-6C, the distance between the gate electrode and the drain contact may be increased, which may serve to reduce capacitance between these components. Further, FIGS. 7A-8C show embodiments where the gate electrodes are offset from the source and drain contacts through the use of non-active regions. This also serves to further reduce capacitance.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A semiconductor structure for use in a III-Nitride (III-N) semiconductor device, comprising: a channel layer; a barrier layer disposed on the channel layer, wherein electrons are formed at an interface between the channel layer and the barrier layer; a source contact and a drain contact disposed over the channel layer; a cap layer disposed between the source contact and the drain contact, which does not make contact with the source contact and the drain contact, and disposed above the channel layer in a height direction; and a gate electrode, wherein the gate electrode contacts a portion of the cap layer, less than an entirety of the cap layer, wherein an active region is defined as a region between the source contact and the drain contact, and wherein the gate electrode is offset in a second direction, perpendicular to a source-drain direction and the height direction such that at least a portion of the gate electrode is disposed outside the active region.

2. The semiconductor structure of claim 1, wherein the cap layer comprises Mg-doped GaN, AlGaN or InGaN.

3. The semiconductor structure of claim 1, wherein the cap layer extends in the second direction beyond the active region.

4. A semiconductor structure for use in a III-Nitride (III-N) semiconductor device, comprising:
   a channel layer;
   a barrier layer disposed on the channel layer, wherein electrons are formed at an interface between the channel layer and the barrier layer;
   a source contact and a drain contact disposed over the channel layer;
   a cap layer disposed between the source contact and the drain contact, and disposed above the channel layer;
   a gate electrode, wherein the gate electrode contacts a portion of the cap layer, less than an entirety of the cap layer; and a dielectric layer disposed between the cap layer and the gate electrode, wherein at least one via is disposed in the dielectric layer to allow the gate electrode to contact the portion of the cap layer,
   wherein the cap layer comprises a first portion extending in a second direction, perpendicular to a source-drain direction, with one or more side regions that extend from the first portion in the source-drain direction, and wherein the at least one via allows the gate electrode to contact the at least one side region.

5. The semiconductor structure of claim 4, wherein the cap layer extends beyond the gate electrode by at least 0.3 μm toward the source contact and/or drain contact.

6. The semiconductor structure of claim 4, wherein the at least one side region extends toward the source contact.

7. The semiconductor structure of claim 4, wherein the gate electrode is disposed above the at least one side region.

8. The semiconductor structure of claim 4, wherein a dimension of the via in the source-drain direction is greater than a dimension of the first portion in the source-drain direction.

9. The semiconductor structure of claim 4, further comprising a field plate disposed between the gate electrode and the drain contact and disposed above the first portion of the cap layer, wherein the dielectric layer is disposed between the cap layer and the field plate.

10. The semiconductor structure of claim 9, wherein the field plate does not overlap the gate electrode.

11. The semiconductor structure of claim 10, wherein the field plate is electrically connected to the source contact.

12. The semiconductor structure of claim 4, wherein the portion comprises less than 90% of the cap layer.

13. A semiconductor structure for use in a III-Nitride (III-N) semiconductor device, comprising:
    a channel layer;
    a barrier layer disposed on the channel layer, wherein electrons are formed at an interface between the channel layer and the barrier layer;
    two or more source contacts and a corresponding number of drain contacts disposed over the channel layer, wherein non-active regions are disposed between adjacent source contacts and/or adjacent drain contacts; and
    wherein the source contacts and corresponding drain contacts are separated by active regions;
    a cap layer that is disposed above the barrier layer; and
    a gate electrode disposed in a region between two non-active regions above the cap layer and contacting the cap layer only in the region between the two non-active regions, and wherein the cap layer extends to the active regions.

14. The semiconductor structure of claim 13, wherein the non-active regions are created by ion implantation of N, F or any other suitable species into the barrier layer and the channel layer.

15. The semiconductor structure of claim 13, wherein the non-active regions are areas where the barrier layer and the channel layer have been etched.

16. The semiconductor structure of claim 13, further comprising a dielectric layer disposed above the cap layer, wherein vias are created in the dielectric layer to allow the gate electrode to contact the cap layer in the region between the two non-active regions.

17. The semiconductor structure of claim 13, further comprising a field plate disposed above the cap layer in the active regions.

18. The semiconductor structure of claim 17, wherein the field plate is electrically connected to the source contacts.

19. The semiconductor structure of claim 4, wherein the cap layer comprises Mg-doped GaN, AlGaN or InGaN.

20. The semiconductor structure of claim 13, wherein the cap layer comprises Mg-doped GaN, AlGaN or InGaN.

21. The semiconductor structure of claim 1, wherein the cap layer extends in the second direction beyond the active region and an entirety of the gate electrode is disposed outside the active region.

22. The semiconductor structure of claim 1, wherein the cap layer is not in contact with the source contact or the drain contact.

23. A semiconductor structure for use in a III-Nitride (III-N) semiconductor device, comprising:
    a channel layer;
    a barrier layer disposed on the channel layer, wherein electrons are formed at an interface between the channel layer and the barrier layer;
    a source contact and a drain contact disposed over the channel layer;
    a cap layer disposed between the source contact and the drain contact, and disposed above the channel layer;
    a gate electrode, wherein the gate electrode contacts a portion of the cap layer, less than an entirety of the cap layer; and a dielectric layer disposed between the cap layer and the gate electrode, wherein a plurality of vias are disposed in the dielectric layer to allow the gate electrode to contact the portion of the cap layer.

24. The semiconductor structure of claim 23, further comprising a field plate disposed between the gate electrode and the drain contact, wherein the dielectric layer is disposed between the cap layer and the field plate.

25. The semiconductor structure of claim 24, wherein the field plate does not overlap the gate electrode.

26. The semiconductor structure of claim 25, wherein the field plate is electrically connected to the source contact.

27. The semiconductor structure of claim 23, wherein the portion comprises less than 90% of the cap layer.

* * * * *